United States Patent
Fujimori et al.

(10) Patent No.: US 7,575,837 B2
(45) Date of Patent: Aug. 18, 2009

(54) COLORED CURABLE COMPOSITION, COLOR FILTER AND METHOD FOR PRODUCING THE SAME

(75) Inventors: Toru Fujimori, Shizuoka-ken (JP); Yuki Mizukawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 545 days.

(21) Appl. No.: 11/412,878

(22) Filed: Apr. 28, 2006

(65) Prior Publication Data
US 2006/0257762 A1 Nov. 16, 2006

(30) Foreign Application Priority Data
Apr. 28, 2005 (JP) ............... 2005-132687

(51) Int. Cl.
 G03F 7/00 (2006.01)
 G02B 5/20 (2006.01)
(52) U.S. Cl. ...................... 430/7; 430/270.1
(58) Field of Classification Search ........... 540/121, 540/133
See application file for complete search history.

(56) References Cited

U.S. PATENT DOCUMENTS

| 2002/0045111 A1* | 4/2002 | Machiguchi et al. ........... 430/7 |
| 2005/0113478 A1* | 5/2005 | Suzuki ........................ 522/71 |

FOREIGN PATENT DOCUMENTS

| JP | 6-75375 A | 3/1994 |
| JP | 7-013014 A * | 1/1995 |
| JP | 7-111485 B2 | 11/1995 |
| JP | 2002-14222 A | 1/2002 |
| JP | 2002-338825 A * | 11/2002 |

* cited by examiner

Primary Examiner—John A. McPherson
(74) Attorney, Agent, or Firm—Sughrue Mion, PLLC

(57) ABSTRACT

The present invention provides a colored curable composition comprising at least one azomethine dye represented by the following formula (I) and one tetraazaporphyrin dye represented by the following formula (A), wherein $R^{11}$ to $R^{15}$: H or a substituent group; $R^{16}$ and $R^{17}$: an alkyl, an alkenyl, an aryl or a heterocyclic group; Za and Zb: —N=, or —C($R^{18}$)=, in which $R^{18}$ is a hydrogen atom, an alkyl, an alkenyl, an aryl, or a heterocyclic group; rings $A^1$ to $A^4$: a benzene ring or a pyridine ring provided that at least one of rings $A^1$ to $A^4$ is a pyridine ring; $R^1$ and $R^2$: H or an alkyl provided that $R^1$ and $R^2$ do not simultaneously represent a hydrogen atom; m=1 to 8; and n=1 to 4.

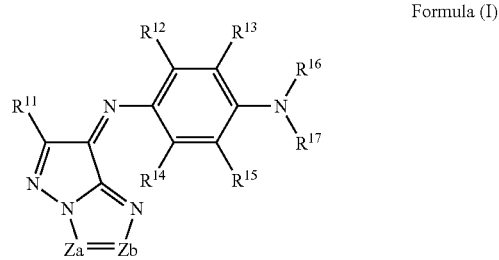

Formula (I)

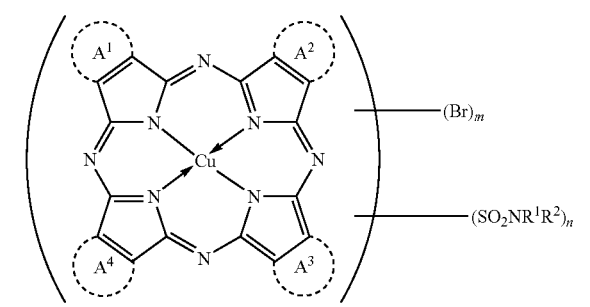

Formula (A)

20 Claims, No Drawings

COLORED CURABLE COMPOSITION, COLOR FILTER AND METHOD FOR PRODUCING THE SAME

CROSS-REFERENCE TO RELATED APPLICATION

This invention claims priority under 35 USC 119 from Japanese Patent Application Nos. 2005-132687, the disclosure of which is incorporated by reference herein.

BACKGROUND OF THE INVENTION

1. Field of the Invention

The present invention relates to a colored curable composition containing a dye, suitable for forming a color filter to be used for a liquid crystal display element or a solid state image pickup element, a dye-containing color filter, and a production method thereof.

2. Description of the Related Art

As a color filter to be formed on a device for realizing a color structure in a solid state image pickup element or a liquid crystal display element, there is known a color filter in which different layers of the color filter are formed in a mutually adjacent manner in a same plane on a substrate. As examples of such a color filter, there are known a color filter constituted of a yellow filter layer, a magenta filter layer and a cyan filter layer, and a color filter constituted of a red filter layer, a green filter layer and a blue filter layer, in which such filter layers are formed in striped patterns or in mosaic patterns.

For producing such color filter, there have been proposed various production methods. Among these, so-called color resist method is widely practiced, in which a patterning process of exposing and developing a dye-containing photosensitive resin composition is repeated by a necessary number of times.

Such color resist method prepares a color filter in a photolithographic process utilizing radiation-sensitive coloring compositions in which pigments are dispersed in various photosensitive compositions, and is considered suitable for preparing a color filter for color displays of a large size and high definition, since it can provide high resistances to light and heat because of the use of pigments and it can provide a sufficient positional precision by photolithographic patterning.

In the case of preparing a color filter by the pigment dispersion method utilizing a pigment dispersion, a radiation-sensitive composition is coated on a glass substrate by a spin coater or a roll coater to obtain a coated film, which is pattern exposed and developed to obtain colored pixels, and the color filter is obtained by repeating such operations for the desired number of colors. Within such pigment dispersion method, a negative-working photosensitive composition utilizing a photopolymerizable monomer and a photopolymerization initiator in combination with an alkali-soluble resin is disclosed in, for example, Japanese Patent Application Laid-Open (JP-A) Nos. 1-102469, 1-152499, 2-181704, 2-199403, 4-76062, 5-273411, 6-184482, 7-140654 and 2002-14222.

However, recently a higher definition is desired for the color filter for use in solid state image pickup elements. Prior pigment dispersion systems, as described above, are incapable of improving the resolution, also, there are associated drawbacks such as unevenness in color due to the presence of coarse pigment particles, and are therefore unsuitable for applications requiring a fine pattern, such as solid state image pickup elements.

To deal with the above-mentioned problems, use of dyes has conventionally been proposed in, for example, JP-A Nos. 6-75375 and 2002-14221, and Japanese Patent Application Publication (JP-B) No. 7-111485.

Also, mixtures of violet dyes and cyan dyes are used for blue color filter arrays of color filters are known in, for example, JP-A No. 2002-14222.

However, dyes containing curable compositions have been associated with the following drawbacks and further improvements have been desired.

(1) Dyes are generally inferior in heat resistance and light resistance compared to pigments, and is thus unsatisfactory in fading resistance;

(2) When a dye has a low molar absorption coefficient, it is required to add the dye in a large amount, whereby other components in the curable composition, such as a polymerizable compound, a binder and a photopolymerization initiator, have to be relatively decreased, thereby resulting in deteriorations in the curing property of the composition when curing, heat resistance of cured portions of the composition or developability of uncured portions; and (3) Dyes often shows interactions with other components in the curable composition, whereby it is difficult to regulate the developability (solubility) of cured portions and uncured portions.

Thus, the dyes that have been employed in the photosensitive composition are not satisfactory in the fading stability, and, having a low solubility in the photosensitive composition, may show a precipitation in a liquid state or in a coated film and cannot be easily contained at a high concentration.

As described, with respect to dye conventionally used for a photosensitive composition, it is generally unsatisfactory in fading resistance, inferior in solubility in the photosensitive composition, and difficult to add at a high concentration.

Further, as described above, dyes for forming mixtures to be used for blue filter arrays are insufficient in heat resistance and light resistance and it is desired to improve the properties.

Also, dyes for forming mixtures to be used for blue filter arrays are insufficient in heat resistance and light resistance and improved properties are desired.

SUMMARY OF THE INVENTION

The present invention has been made in view of the above circumstances and provides a colored curable composition, color filter and method for producing the same.

A first aspect of the invention provides a colored curable composition comprising at least one azomethine dye represented by the following formula (I) and at least one tetraazaporphyrin dye represented by following formula (A):

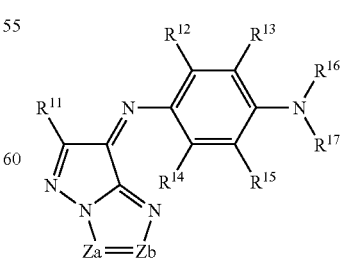

Formula (I)

wherein $R^{11}$ represents a hydrogen atom or a substituent group; $R^{12}$, $R^{13}$, $R^{14}$, and $R^{15}$ each independently represent a hydrogen atom, or a substituent group; $R^{16}$ and $R^{17}$ each independently represent an alkyl, an alkenyl, an aryl or a heterocyclic group; Za and Zb each independently represent —N=, or —C($R^{18}$)=; $R^{18}$ represents a hydrogen atom, an alkyl, an alkenyl, an aryl, or a heterocyclic group; $R^{12}$ and $R^{13}$, $R^{13}$ and $R^{16}$, $R^{14}$ and $R^{15}$, $R^{15}$ and $R^{17}$ or $R^{16}$ and $R^{17}$ each independently may be bonded to each other to form a 5- to 7-membered ring;

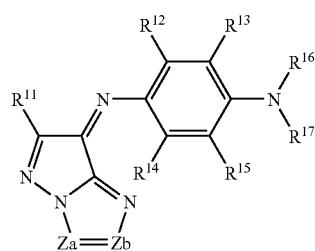

Formula (I)

wherein $R^{11}$ represents a hydrogen atom or a substituent group; $R^{12}$, $R^{13}$, $R^{14}$, and $R^{15}$ each independently represent a hydrogen atom, or a substituent group; $R^{16}$ and $R^{17}$ each independently represent an alkyl, an alkenyl, an aryl or a heterocyclic group; Za and Zb each independently represent —N=, or —C($R^{18}$)=; $R^{18}$ represents a hydrogen atom, an alkyl, an alkenyl, an aryl, or a heterocyclic group; $R^{12}$ and $R^{13}$, $R^{13}$ and $R^{16}$, $R^{14}$ and $R^{15}$, $R^{15}$ and $R^{17}$ or $R^{16}$ and $R^{17}$ each independently may be bonded to each other to form a 5- to 7-membered ring;

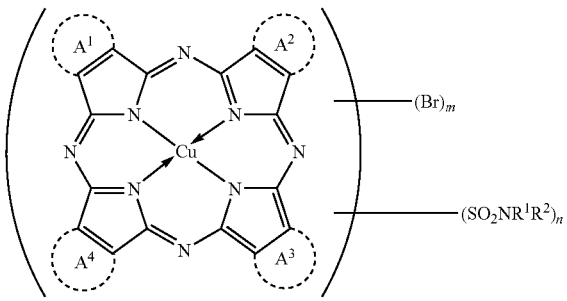

Formula (A)

wherein ring $A^1$, ring $A^2$, ring $A^3$, and ring $A^4$ each independently represent the following formula(1) or formula(2) and at least one of ring $A^1$, ring $A^2$, ring $A^3$, and ring $A^4$ represents formula(2);

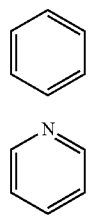

Formula (1)

Formula (2)

$R^1$ and $R^2$ each independently represent a hydrogen atom or a substituted or unsubstituted alkyl group; m represents an integer of 1 to 8; n represents an integer of 1 to 4; $R^1$ and $R^2$ do not simultaneously represent hydrogen atoms.

The second aspect of the invention provides a color filter comprising at least one azomethine dye represented by the above formula (I) and at least one tetraazaporphyrin dye represented by the above formula (A).

The third aspect of the invention provides a method of producing a color filter comprising; applying a colored curable composition comprising at least one kind of azomethine dye represented by the above formula (I) and at least one kind of tetraazaporphyrin dye represented by the above formula (A) onto a substrate; then exposing the composition through a mask, and developing the exposed composition to form patterns.

DETAILED DESCRIPTION OF THE INVENTION

Hereinafter, a colored curable composition, color filter and method for producing the same of the present invention will be described in detail.

(Colored Curable Composition)

A colored curable composition of the invention (hereinafter, referred to as a composition of the invention in some cases) contains at least an azomethine dye represented by the following formula (I) and a tetraazaporphyrin dye represented by the following formula (A) as colorants (hereinafter, referred collectively to as coloring compounds in some cases) and preferably further contains a binder, a polymerizable compound, and a radiation sensitive compound. Further, in general, the composition may be produced by using a solvent and also if necessary, by using other components such as a cross-linking agent.

—Colorant—

<Azomethine Dye Represented by the Formula (I)>

The colored curable composition of the invention comprises at least one azomethine dye represented by the following formula (I). The dye does not precipitate with lapse of time in form of a liquid-state prepared product or an applied coating film and is thus excellent in stability and has excellent resistance to heat and light and developability with suppressed development residues.

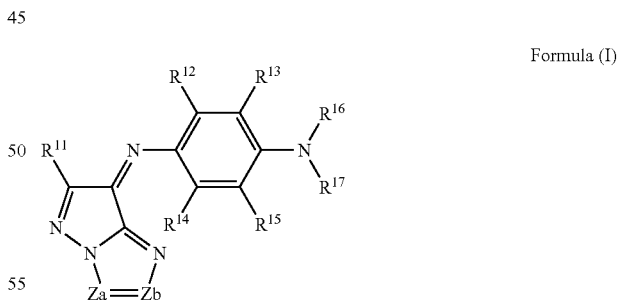

Formula (I)

wherein $R^{11}$ represents a hydrogen atom or a substituent group; $R^{12}$, $R^{13}$, $R^{14}$, and $R^{15}$ each independently represent a hydrogen atom, or a substituent group; $R^{16}$ and $R^{17}$ each independently represent an alkyl, an alkenyl, an aryl or a heterocyclic group; Za and Zb each independently represent —N=, or —C($R^{18}$)=; $R^{18}$ represents a hydrogen atom, an alkyl, an alkenyl, an aryl, or a heterocyclic group; $R^{12}$ and $R^{13}$, $R^{13}$ and $R^{16}$, $R^{14}$ and $R^{15}$, $R^{15}$ and $R^{17}$ or $R^{16}$ and $R^{17}$ each independently may be bonded to each other to form a 5- to 7-membered ring;

Hereinafter, $R^{11}$ to $R^{17}$, and Za and Zb of the formula (I) will be described in detail.

In the above-mentioned formula (I), $R^{11}$ represents a hydrogen atom or a substituent group. The substituent group represented by $R^{11}$ includes a halogen atom (e.g., a fluorine atom, a chlorine atom, and a bromine atom); an alkyl group (e.g., an alkyl group preferably having 1 to 48 carbon atoms and more preferably a straight chain, branched, or cyclic alkyl having 1 to 18 carbon atoms such as methyl, ethyl, propyl, isopropyl, butyl, tert-butyl, pentyl, hexyl, heptyl, octyl, 2-ethylhexyl, dodecyl, hexadecyl, cyclopropyl, cyclopentyl, cyclohexyl, 1-norbornyl, and 1-adamantyl); an alkenyl group (e.g., an alkenyl group preferably having 2 to 48 carbon atoms and more preferably 2 to 12 carbon atoms such as vinyl, aryl, 3-buten-1-yl); an aryl group (e.g., an aryl group preferably having 6 to 48 carbon atoms and more preferably 6 to 12 carbon atoms such as phenyl and naphthyl); a heterocyclic group (e.g., a heterocyclic group preferably having 1 to 32 carbon atoms and more preferably 1 to 12 carbon atoms such as 2-thienyl, 4-pyridyl, 2-furyl, 2-pyrimidinyl, 1-pyridyl, 2-benzothiazolyl, 1-imidazolyl, 1-pyradolyl, and benzotroazol-1-yl); a silyl group (e.g., a silyl group having 3 to 38 carbon atoms and more preferably 3 to 12 carbon atoms such as trimethylsilyl, triethylsilyl, tributylsilyl, tert-butyldimethylsilyl, and tert-hexylmethylsilyl); hydroxy group; a cyano group; a nitro group; an alkoxy group [e.g., an alkoxy group preferably having 1 to 48 carbon atoms and more preferably 1 to 12 carbon atoms such as methoxy, ethoxy, 1-butoxy, 2-butoxy, isopropoxy, tert-butoxy, dodecyloxy, and a cycloalkyloxy (such as cyclopentyloxy and a cyclohexyloxy)];

an aryloxy group (e.g., an aryloxy group preferably having 6 to 48 carbon atoms and more preferably 6 to 12 carbon atoms such as such as phenoxy and 1-naphthoxy); a heterocyclic oxy group (e.g., a heterocyclic oxy group preferably having 1 to 32 carbon atoms and more preferably 1 to 12 carbon atoms such as 1-phenyltetrazol-5-oxy and 2-tetrahydropiranyloxy); a silyloxy group (e.g., a silyloxy preferably having 1 to 32 carbon atoms and more preferably 1 to 12 carbon atoms such as trimethylsilyloxy, tert-butydimethylsilyloxy, and diphenylmethylsilyloxy); an acyloxy group (e.g., an acyloxy group preferably having 2 to 48 carbon atoms and more preferably 2 to 12 carbon atoms such as acetoxy, pivaloyloxy, benzoyloxy, and dodecanoyloxy);

an alkoxycarbonyloxy group [e.g., an alkoxycarbonyloxy group preferably having 2 to 48 carbon atoms and more preferably 2 to 12 carbon atoms such as ethoxycarbonyloxy, tert-butoxycarbonyloxy, and a cycloalkyloxycarbonyloxy (such as cyclohexyloxycarbonyloxy)]; an aryloxycarbonyloxy group (e.g., an aryloxycarbonyloxy group preferably having 7 to 32 carbon atoms and more preferably 7 to 18 carbon atoms such as phenoxycarbonyloxy); a carbamoyloxy group (e.g., a carbamoyloxy group preferably having 1 to 48 carbon atoms and more preferably 1 to 12 carbon atoms such as N,N-dimethylcarbamoyloxy, N-butylcarbamoyloxy, N-phenylcarbamoyloxy, and N-ethyl-N-phenylcarbamoyloxy); a sulfamoyloxy group (e.g., a sulfamoyloxy group preferably having 1 to 32 carbon atoms and more preferably 1 to 12 carbon atoms such as N,N-diethylsulfamoyloxy and N-propylsulfamoyloxy); an alkylsulfonyloxy group (e.g., an alkylsulfonyloxy group preferably having 1 to 38 carbon atoms and more preferably 1 to 12 carbon atoms such as methylsulfonyloxy, hexadecylsulfonyloxy, and cyclohexylsulfonyloxy); an arylsulfonyloxy group (e.g., an arylsulfonyloxy group preferably having 2 to 48 carbon atoms and more preferably 2 to 12 carbon atoms such as methylsulfonyloxy, hexadecylsulfonyloxy, and cyclohexylsulfonyloxy); an arylsulfonyloxy group (e.g., an arylsulfonyloxy group preferably having 6 to 32 carbon atoms and more preferably 6 to 12 carbon atoms such as phenylsulfonyloxy); an acyl group (e.g., an acyl group preferably having 1 to 48 carbon atoms and more preferably 1 to 12 carbon atoms such as such as formyl, acetyl, pivaloyl, benzoyl, tetradecanoyl, and cyclohexanoyl); an alkoxycarbonyl group (e.g., an alkoxycarbonyl group preferably having 2 to 48 carbon atoms and more preferably 2 to 12 carbon atoms such as methoxycarbonyl, ethoxycarbonyl, octadecyloxycarbonyl, and cyclohexyloxycarbonyl); an aryloxycarbonyl group (e.g., an aryloxytcarbonyl group preferably having 7 to 32 carbon atoms and more preferably 7 to 12 carbon atoms such as phenoxycarbonyl);

a carbamoyl group (e.g., a carbamoyl group preferably having 1 to 48 carbon atoms and more preferably 1 to 12 carbon atoms such as carbamoyl, N,N-diethylcarbamoyl, N-ethyl-N-octylcarbamoyl, N,N-dibutylcarbamoyl, N-propylcarbamoyl, N-phenylcarbamoyl, N-methyl-phenylcarbamonyl, and N,N-dicyclohexylcarbamoyl); an amino group (e.g., an amino group preferably having 32 carbon atoms or less and more preferably 12 carbon atoms or less such as amino, methylamino, N,N-dibutylamino, tetradecylamino, 2-ethylhexylamino, and cyclohexylamino); an anilino group (e.g., an anilino group preferably having 6 to 32 carbon atoms and more preferably 6 to 12 carbon atoms such as anilino and N-methylanilino); a heterocyclic amino group (e.g., a heterocyclic amino group preferably having 1 to 32 carbon atoms and more preferably 1 to 12 carbon atoms such as 4-pyridylamino); a carbonamido group (e.g., a carbonamido group preferably having 2 to 48 carbon atoms and more preferably 2 to 12 carbon atoms such as acetamido, benzamido, tetradecanamido, pivaloylamido, and cyclohexanamido); an ureido group (e.g., an ureido group preferably having 1 to 32 carbon atoms and more preferably 1 to 12 carbon atoms such as ureido, N,N-dimethylureido, and N-phenylureido); an imido group (e.g., an imido group preferably having 20 carbon atoms or less and more preferably 12 carbon atoms or less such as N-succinimido, and N-phthalimido); an alkoxycarbonylamino group (e.g., an alkoxycarbonylamino group preferably having 2 to 48 carbon atoms and more preferably 2 to 18 carbon atoms such as methoxycarboxylamino, ethoxycarbonylamino, tert-butoxycarbonylamino, octadecyloxycarbonylamino, and cyclohexyloxycarbonylamino); an aryloxycarbonylamino group (e.g., an aryloxycarbonylamino group preferably having 7 to 32 carbon atoms and more preferably 7 to 12 carbon atoms such as phenoxycarbonylamino); a sulfonamido group (e.g., a sulfonamido group preferably having 1 to 48 carbon atoms and more preferably 1 to 12 carbon atoms such as methanesulfonamido, butanesulfonamido, benzenesulfonamido, hexadecanesulfonamido, and cyclohexanesulfonamido); a sulfamoylamino group (e.g., a sulfamoylamino group preferably having 1 to 48 carbon atoms and more preferably 1 to 12 carbon atoms such as N,N-dipropylsulfamoylamino and N-ethyl-N-dodecylsulfamoylamino); an azo group (e.g., an azo group preferably having 1 to 48 carbon atoms and more preferably 1 to 24 carbon atoms such as phenylazo and 3-pyrazolylazo); an alkylthio group (e.g., an alkylthio group preferably having 1 to 48 carbon atoms and more preferably 1 to 12 carbon atoms such as methylthio, ethylthio, octylthio, and cyclohexylthio); an arylthio group (e.g., an arylthio group preferably having 6 to 48 carbon atoms and more preferably 6 to 12 carbon atoms such as phenylthio); a heterocyclic thio group (e.g., a heterocyclic thio group preferably having 1 to 32 carbon atoms and more preferably 1 to 12 carbon atoms such as 2-benzothiazolylthio, 2-pylidylthio, 1-phenyltetrazolylthio); an alkylsulfinyl group (e.g., an alkylsulfinyl group preferably having 1 to 32 carbon atoms and more preferably 1 to 12 carbon atoms such as dodecansulfinyl); an arylsulfinyl group (e.g., a arylsulfinyl group preferably having 6 to 32 carbon atoms and more preferably 6 to 12 carbon atoms such as phenylsulfinyl); an alkylsulfonyl group (e.g., an alkylsulfonyl group preferably having 1 to 48 carbon atoms and more preferably 1 to 12 carbon atoms such as methylsulfonyl, ethylsulfonyl, propylsulfonyl, butylsulfonyl, isopropylsulfonyl, 2-ethylhexylsulfonyl, hexadecylsulfonyl, octylsulfonyl, and cyclohexylsulfonyl); an arylsulfonyl group (e.g., an arylsulfonyl group preferably having 4 to 48 carbon atoms and more preferably 6 to 12 carbon atoms such as phenylsulfonyl and 1-naphthylsulfonyl); a sulfamoyl group (e.g., a sulfamoyl group preferably having 32 carbon atoms or less and more preferably 16 carbon atoms or less such as sulfamoyl, N,N-dipropylsulfamoyl, N-ethyl-N-dodecylsulfamoyl, N-ethyl-N-phenylsulfamoyl, and N-cyclohexylsulfamoyl); a sulfo group; a phosphonyl group (e.g., a phosphonyl group preferably having 1 to 32 carbon atoms and more preferably 1 to 12 carbon atoms such as phenoxyphosphonyl, octyloxyphosphonyl, and phenylphosphonyl); a phosphinoylamino group (e.g., a phosphinoylamino group preferably having 1 to 32 carbon atoms and more preferably 1 to 12 carbon atoms such as diethoxyphosphinoylamino and dioctyloxyphosphinoylamino.

In the case where the substituent group represented by $R^{11}$ is a farther substitutable group, the above-exemplified groups of $R^{11}$ may be substituted and in the case where the substituent group has two or more substituent groups, these substituent groups may be same or different.

$R^{12}$ to $R^{15}$ in the formula (I) each independently represent a hydrogen atom, or a substituent group and the substituent group represented by $R^{12}$ to $R^{15}$ is defined same as the substituent group represented by $R^{11}$, and preferable embodiments are also same. In the case where the substituent group represented by $R^{12}$ to $R^{15}$ is a further substitutable group, the substituent group may be further substituted with the above-exemplified groups of $R^{11}$ and in the case where the substituent group has two or more substituent groups, these substituent groups may be same or different.

$R^{16}$ and $R^{17}$ in the formula (each independently represent an alkyl, an alkenyl, an aryl, or a heterocyclic ring and the alkyl, the alkenyl, the aryl, and the heterocyclic ring represented by $R^{16}$ and $R^{17}$ are defined same as the alkyl, the alkenyl, the aryl, and the heterocyclic ring explained for the substituent group represented by $R^{11}$ and preferable group ranges are also same.

In the case where the substituent groups represented by $R^{16}$ and $R^{17}$ are further substitutable groups, the groups may be further substituted with the above-exemplified groups of $R^{11}$ and in the case where the substituent groups have each two or more substituent groups, these substituent groups may be same or different.

In the above-mentioned formula (I), Za and Zb each independently represent —N═, or —C($R^{18}$)═; and $R^{18}$ represents a hydrogen atom, an alky, an alkenyl, an aryl, or a heterocyclic group. The alkyl, the alkenyl, the aryl, and the heterocyclic ring represented by $R^{18}$ are defined same as the alkyl, the alkenyl, the aryl, and the heterocyclic ring explained for the substituent group represented by $R^{11}$ and preferable group ranges are also same.

In the case where the substituent group represented by $R^{18}$ is a further substitutable group, the group may be further substituted with the above-exemplified groups of $R^{11}$ and in the case where the substituent group has two or more substituent groups, these substituent groups may be same or different.

Among these, —N═ is preferable for Za and —C($R^{18}$)═ is preferable for Zb. Also, $R^{18}$ is preferably an alkyl group, a substituted alkyl group, an aryl group, or a substituted aryl group and more preferably in a form of the following embodiment defined by the following formula (II) or (III).

In the above formula (I), $R^{12}$ and $R^{13}$, $R^{13}$ and $R^{16}$, $R^{14}$ and $R^{15}$, $R^{15}$ and $R^{17}$ or $R^{16}$ and $R^{17}$ each independently may be bonded to each other to form a 5- to 7-membered ring. The 5- to 7-membered rings may be further substituted with the above-exemplified groups of $R^{11}$ and in the case where the substituent groups have each two or more substituent groups, these substituent groups may be same or different.

Among the azomethine dye represented by the formula (I) are a azomethine dye represented by the following formula (II). Hereinafter, $R^{19}$ to $R^{24}$, $R^{51}$ to $R^{54}$, $R^{56}$, Zc and Zd in the formula (II) will be described in detail.

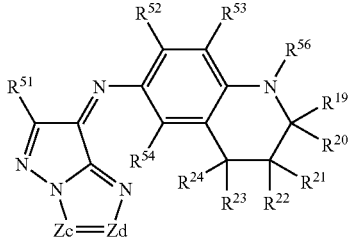

Formula (II)

In the above formula (II), $R^{19}$, $R^{20}$, $R^{21}$, $R^{22}$, $R^{23}$, and $R^{24}$ each independently represent a hydrogen atom or a substituent group and the substituent groups represented by $R^{19}$ to $R^{24}$ are defined same as the substituent groups represented by $R^{11}$, and preferable embodiments are also same.

In the case where the substituent groups represented by $R^{19}$ to $R^{24}$ are further substitutable groups, the substituent groups may be substituted each with a substituent group represented by $R^{11}$ and in the case where the substituent groups have two or more substituent groups each, these substituent groups may be same or different.

In the above formula (II), $R^{51}$ represents a hydrogen atom or a substituent group and the substituent group represented by $R^{51}$ is defined same as the substituent group represented by $R^{11}$, and preferable embodiments are also same. In the case where the substituent group represented by $R^{51}$ is a further substitutable group, the substituent group may be further substituted with a substituent group represented by $R^{11}$ and in the case where the substituent group has two or more substituent groups, these substituent groups may be same or different.

In the above formula (II), $R^{52}$, $R^{53}$, and $R^{54}$ each independently represents a hydrogen atom or a substituent group. $R^{52}$ is same as the substituent group represented by $R^{12}$ in the formula (I) and its preferable embodiments are also same: $R^{53}$ is same as the substituent group represented by $R^{13}$ in the formula (I) and its preferable embodiments are also same: $R^{54}$ is same as the substituent group represented by $R^{14}$ in the formula (I) and its preferable embodiments are also same: and $R^{56}$ is same as the substituent group represented by $R^{16}$ in the formula (I) and its preferable embodiments are also same.

In the case where the groups represented by $R^{52}$ to $R^{54}$ are further substitutable groups, the substituent groups may be substituted each with a substituent group represented by $R^{11}$ and in the case where the substituent group has two or more substituent groups, these substituent groups may be same or different.

Further, in the formula (II), $R^{52}$ and $R^{53}$, $R^{53}$ and $R^{56}$, $R^{56}$ and $R^{19}$ or $R^{54}$ and $R^{24}$ may be bonded to each other to form a 5- to 7-membered ring.

In the formula (II), Zc is defined same as the above-mentioned Za in the formula (I) and its preferable embodiments are also same and Zd is defined same as the above-mentioned Zb in the formula (I) and its preferable embodiments are also same.

Among the azomethine dye represented by the above-mentioned formula (II) are preferably azomethine dye represented by the following formula (III).

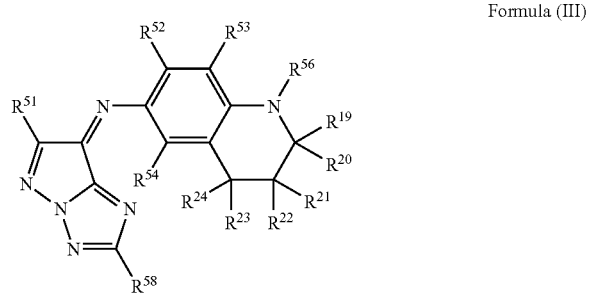

Formula (III)

In the formula (III), $R^{19}$ to $R^{24}$ and $R^{51}$ to $R^{54}$ are each independently defined same as $R^{19}$ to $R^{24}$ and $R^{51}$ to $R^{54}$ in the above-mentioned formula (II) and $R^{58}$ represents a hydrogen atom, an alkyl, an alkenyl, an aryl or a heterocyclic group.

The alkyl, alkenyl, aryl or heterocyclic group represented by $R^{58}$ are respectively defined same as the alkyl, alkenyl, aryl or heterocyclic group described for the substituent group represented by $R^{11}$ and their preferable embodiments are also same.

Further, $R^{58}$ may be substituted with the substituent group described for $R^{11}$ and in the case where it is substituted with two or more substituent groups, these substituent groups may be same or different.

As described above, the azomethine dyes represented by the formula (I) are preferably the azomethine dyes represented by the formula (II) and even more preferably the azomethine dye represented by the formula (III).

Preferable ranges of the dyes represented by the formula (III) will be described below.

Preferable azomethine dyes represented by the above-mentioned formula (III) in which $R^{51}$ is an alkyl, an alkenyl, an aryl, a heterocyclic group, a hydroxyl, a cyano, an alkoxy, an aryloxy, a heterocyclic oxy group, a carbamoyloxy, an acyl, an alkoxycarbonyl, an aryloxycarbonyl, a carbamoyl, an imido group, an azo group, an alkylthio, an arylthio, a heterocyclic thio group, an alkylsulfinyl, an arylsulfinyl, an alkylsulfonyl, an arylsulfonyl, a sulfamoyl, a sulfo, a phosphonyl, or a phosphinoylamino group; $R^{52}$, $R^{53}$, and $R^{54}$ are each independently a hydrogen atom, a halogen atom, an alkyl, an alkenyl, an aryl, a heterocyclic group, an alkoxy, an aryloxy, an alkoxycarbonyl, a carbamoyl, an amino, an anilino, a carbonamido, an ureido, an alkoxycarbonylamino, a sulfonamido, a sulfamoylamino, an azo group, an alkyltio, an arylthio, a heterocyclic thio group, an alkylsulfinyl, an arylsulfinyl, an alkylsulfonyl, an arylsulfonyl, a sulfamoyl, a sulfo, a phosphonyl, or a phosphinoylamino group; $R^{56}$ is an alkyl, an alkenyl, an aryl, a heterocyclic group; $R^{58}$ is a hydrogen atom, an alkyl, an alkenyl, an aryl, or a heterocyclic group; and $R^{19}$ to $R^{24}$ are each independently a hydrogen atom, a halogen atom, an alkyl, or an alkoxy group.

More preferable azomethine dyes are those represented by the above-mentioned formula (III) in which $R^{51}$ is an alkyl, an alkenyl, an aryl, a heterocyclic group, alkoxycarbonyl, a carbamoyl, an imido, an alkylthio, an arylthio, a heterocyclic thio group, an alkylsulfonyl, or an arylsulfonyl goup; $R^{52}$, $R^{53}$, and $R^{54}$ are each independently a hydrogen atom, a halogen atom, an alkyl, an alkoxy, an aryloxy, an alkoxycarbonyl, a carbamoyl, a carbonamido, an ureido, an alkoxycarbonylamino, a sulfonamido, an alkylthio, or an arylthio group; $R^{56}$ is an alkyl, an alkenyl, an aryl, or a heterocyclic group; $R^{58}$ is a hydrogen atom, an alkyl, an alkenyl, an aryl, or a heterocyclic group; and $R^{19}$ to $R^{24}$ are each independently a hydrogen atom or an alkyl.

Furthermore preferable azomethine dyes are those represented by the above-mentioned formula (III) in which $R^{51}$ is an alkyl, an aryl, a heterocyclic group, alkoxycarbonyl, a carbamoyl, an alkylthio, an arylthio, an alkylsulfonyl, or an arylsulfonyl group; $R^{52}$, $R^{53}$, and $R^{54}$ are each independently a hydrogen atom, a halogen atom, an alkyl, an alkoxy, an aryloxy, an alkoxycarbonyl, a carbamoyl, a carbonamido, an ureido, an alkoxycarbonylamino, a sulfonamido, an alkylthio, or an arylthio group; $R^{56}$ is an alkyl or an aryl; $R^{58}$ is a hydrogen atom, an alkyl, an alkenyl, an aryl, or a heterocyclic group; and $R^{19}$ to $R^{24}$ are each independently a hydrogen atom or an azomethine dyes as an alkyl group.

Even more preferable azomethine dyes are those represented by the above-mentioned formula (III) in which $R^{51}$ is an alkyl; $R^{52}$, $R^{53}$, and $R^{54}$ are each independently a hydrogen atom, a halogen atom, an alkyl, or an alkoxy group; $R^{56}$ is an alkyl; $R^{58}$ is an alkyl, an alkenyl, an aryl, or a heterocyclic group; $R^{19}$ and $R^{20}$ are alkyl groups, $R^{21}$ to $R^{23}$ are hydrogen atoms and $R^{24}$ is an azomethine dyes as an alkyl group.

Hereinafter, specific examples (exemplified dye M-1 to M-84) represented by the formula (I) are shown below. However, the invention should not be limited to these examples.

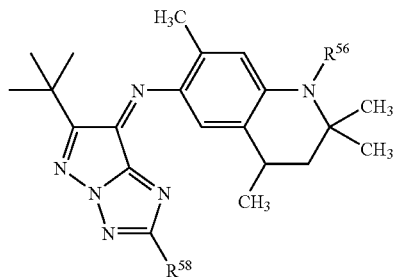

| No. of exemplified dye | R⁵⁸ | R⁵⁶ |
|---|---|---|
| M-1 | —CHCH₂NHCOCH(C₂H₅)O—C₆H₄—OCH₃ (with CH₃ branch) | —CH₂CH₂CH₂OH |
| M-2 | " | —CH₂CH₂OH |
| M-3 | " | —CH₂COOC₂H₅ |
| M-4 | " | —CH₂CH₂COOH |
| M-5 | 同上 | —C₃H₇(iso) |
| M-6 | —CHCH₂NHCOCH(C₂H₅)O—C₆H₃(C₄H₉(t))(OH) (with CH₃ branch) | —CH₂CH(C₂H₅)C₄H₉ |
| M-7 | —CHCH₂NH—COCHC₄H₉ (with CH₃ and C₂H₅ branches) | —CH₂CH₂NHSO₂CH₃ |
| M-8 | —CHCH₂NHSO₂CH₃ (with CH₃ branch) | —CH₂CH₂CH₂COOH |
| M-9 | —CHCH₂NHSO₂CH₃ (with CH₃ branch) | —CH₂CH₂CH₂CH₂COOH |
| M-10 | —CHCH₂NH—CO—C₆H₄—OH (with CH₃ branch) | —CH₂CH₂CH₂OH |
| M-11 | —CHCH₂NH—CO—(2-pyridyl) (with CH₃ branch) | " |
| M-12 | 3-methylpyridine | " |
| M-13 | —CHCH₂NHCOCH(C₂H₅)O—C₆H₄—OCH₃ (with CH₃ branch) | —CH₂CH₂O—C₆H₄—N(thiomorpholine-S,S-dioxide) |

-continued
| | | |
|---|---|---|
| M-14 | 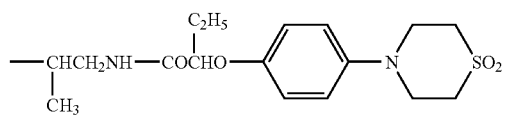 | 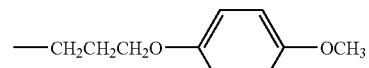 |
| M-15 | —CHCH$_2$NHCOCH$_2$OCH$_2$COOH<br>    \|<br>    CH$_3$ | —CH$_2$CH(C$_2$H$_5$)C$_4$H$_9$ |
| M-16 | 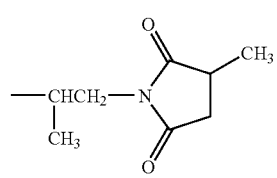 | " |
| M-17 | 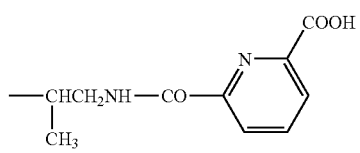 | —C$_8$H$_{17}$ |
| M-18 | 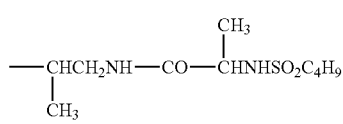 | " |
| M-19 | 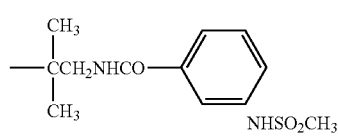 | —CH$_2$CH$_2$OH |
| M-20 | 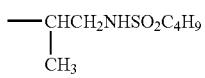 | " |
| M-21 | 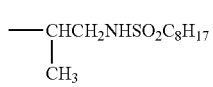 | " |
| M-22 | 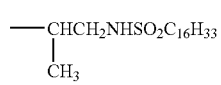 | —C$_2$H$_5$ |
| M-23 | 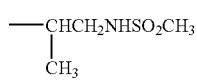 |  |
| M-24 | 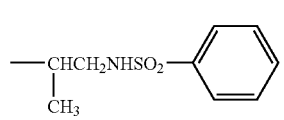 | " |
| M-25 | 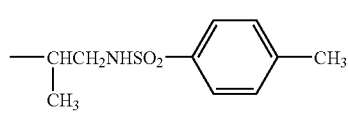 | —CH$_2$CH$_2$OH |
| M-26 | 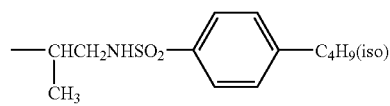 | " |

-continued
| | | |
|---|---|---|
| M-27 | 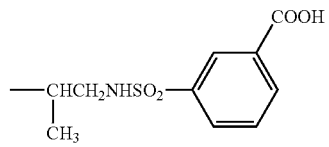 | " |
| M-28 | 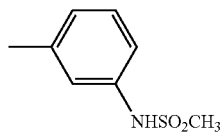 | —CH₂CH(C₂H₅)C₄H₉ |
| M-29 | 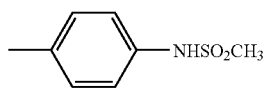 | " |
| M-30 | 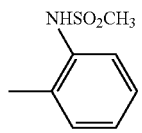 | —C₁₂H₂₆ |
| M-31 | 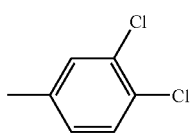 | " |
| M-32 | 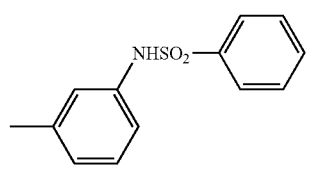 | —CH₂CH₂OH |
| M-33 | 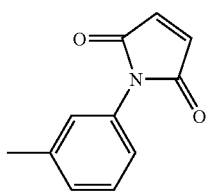 | " |
| M-34 | 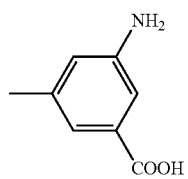 | —CH₂CH(C₂H₅)C₄H₉ |
| M-35 | 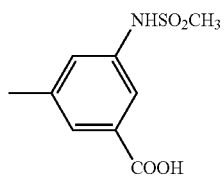 | 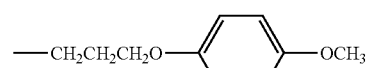 |
| M-36 | " | 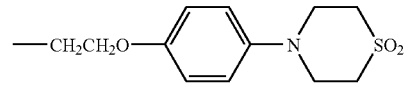 |

-continued
| | | |
|---|---|---|
| M-37 | ![pyridine-COOH with methyl] | —CH₂CH₂O—⟨C₆H₄⟩—OCH₃ |
| M-38 | —CF₃ | " |
| M-39 | —C₇F₁₅ | " |
| M-40 | —CHCH₂NHSO₂C₈H₁₇<br>    \|<br>   CH₃ | —CH₂CH₂SO₂CH₃ |
| M-41 | " | —CH₂CH₂SC₄H₉ |
| M-42 | " | —CH₂CH₂OCH₂CH₂OCH₃ |
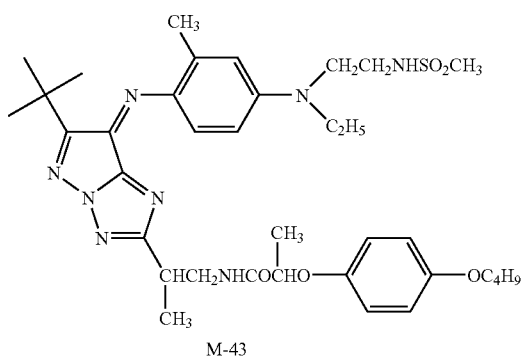
M-43
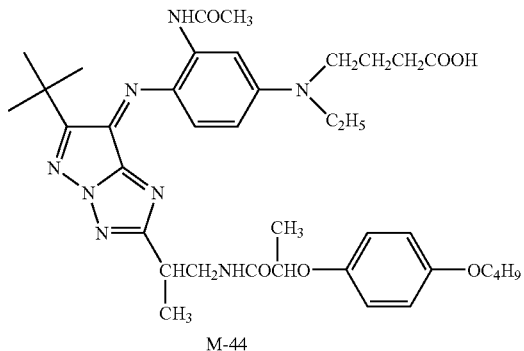
M-44
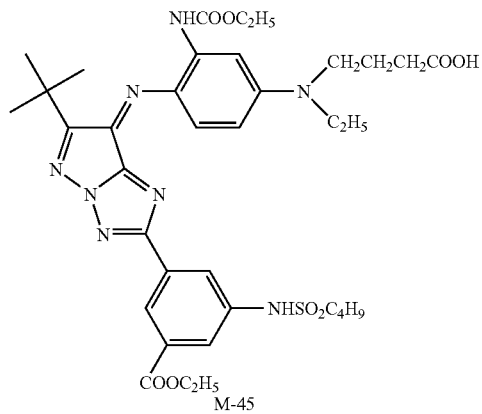
M-45

-continued
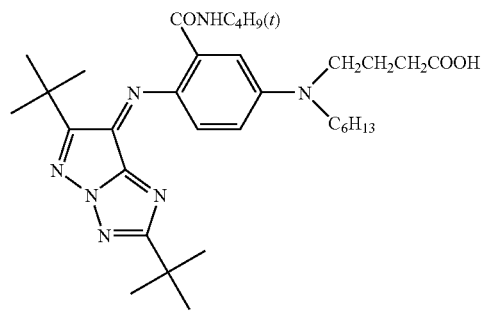
M-46
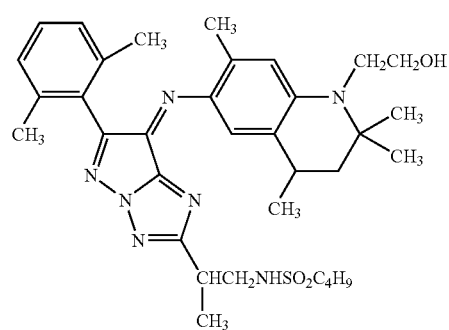
M-47
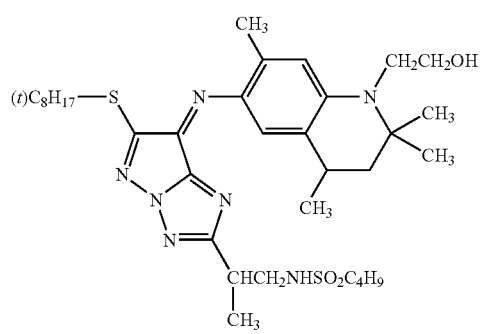
M-48
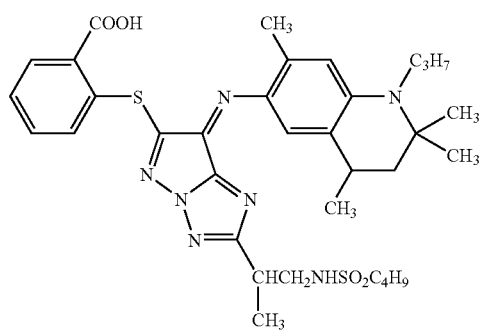
M-49

-continued
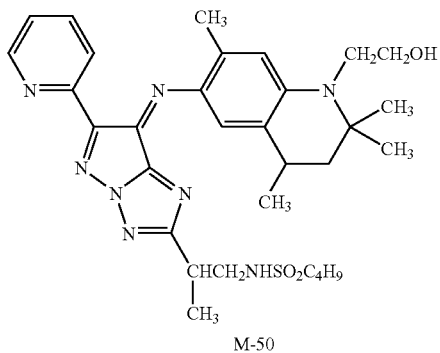
M-50
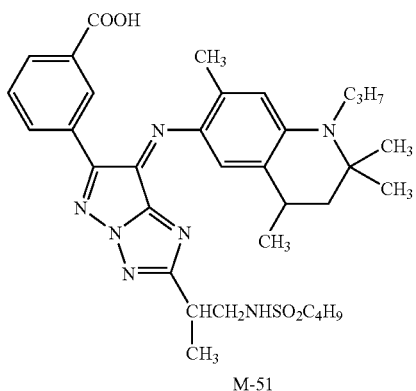
M-51
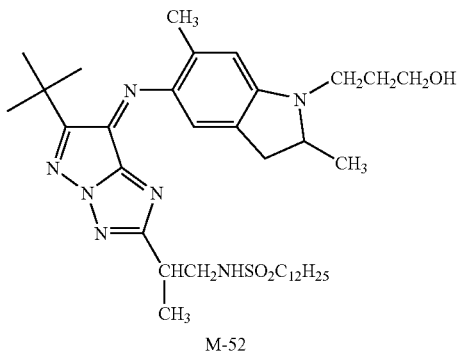
M-52
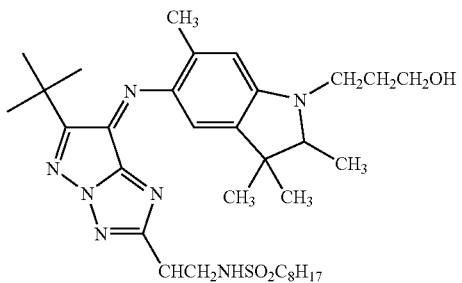
M-53

-continued
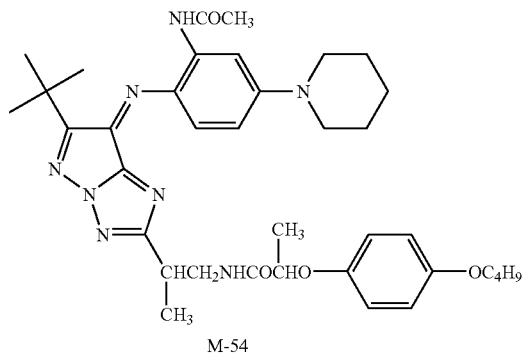
M-54
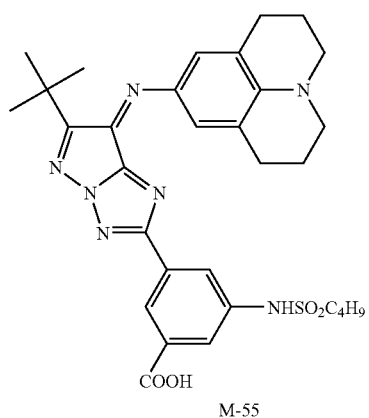
M-55
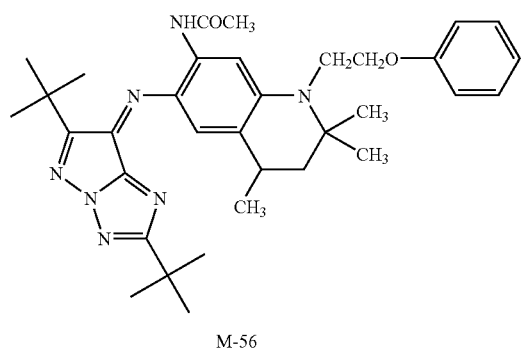
M-56
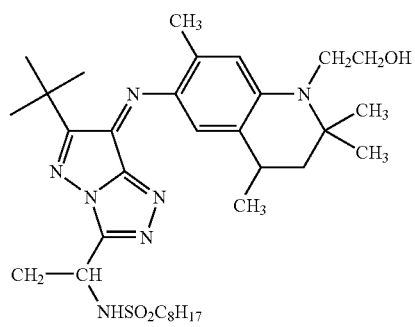
M-57

-continued
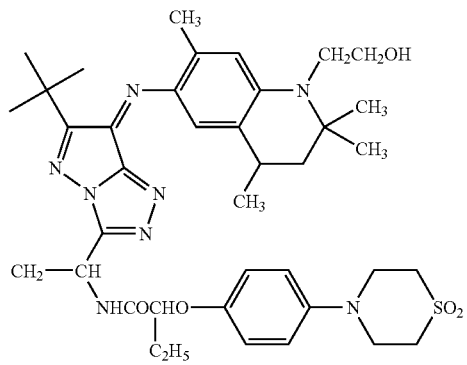
M-58
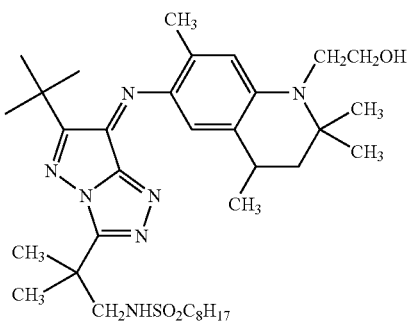
M-59
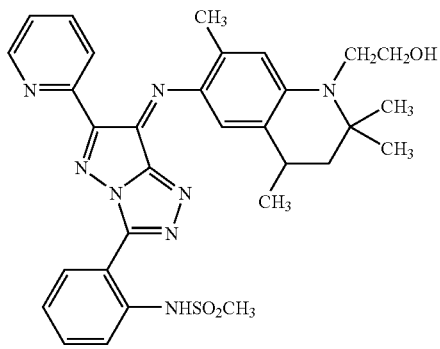
M-60
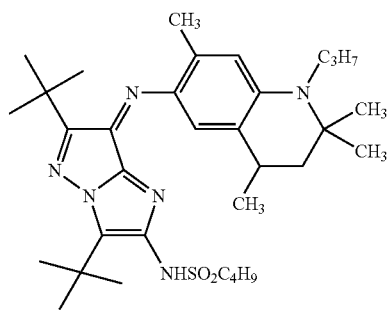
M-61

-continued
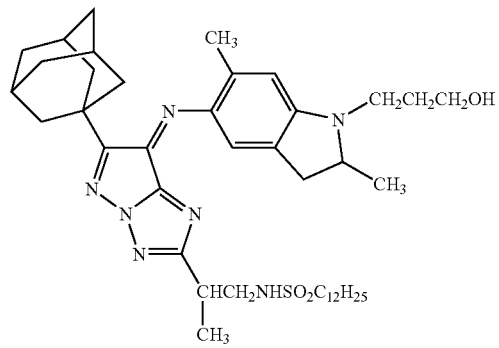
M-62
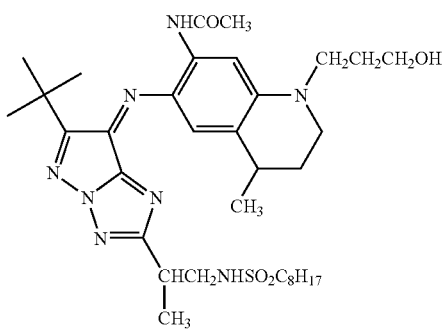
M-63
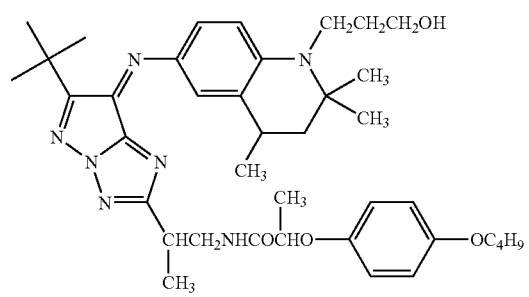
M-64
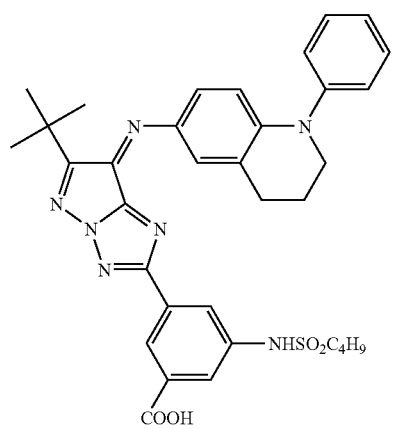
M-65

-continued
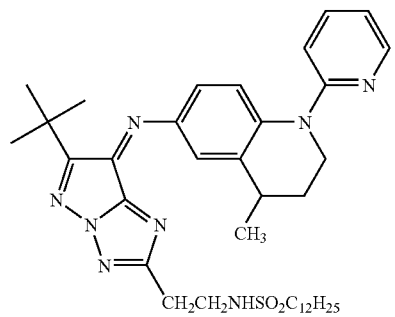
M-66
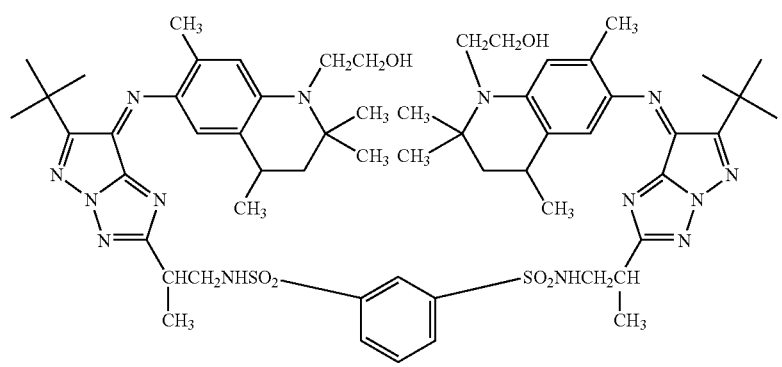
M-67
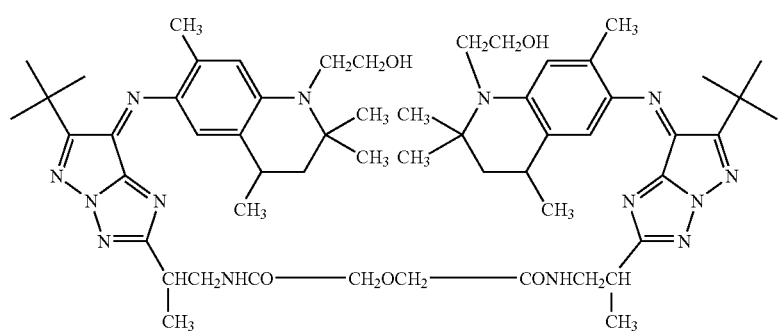
M-68
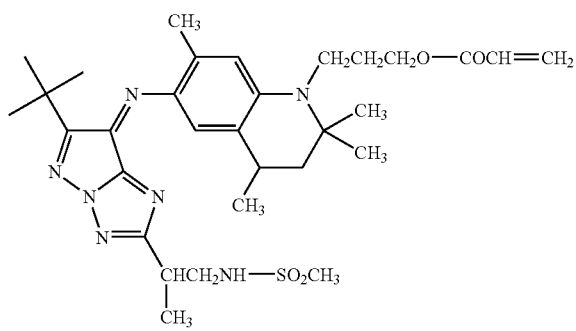
M-69

-continued
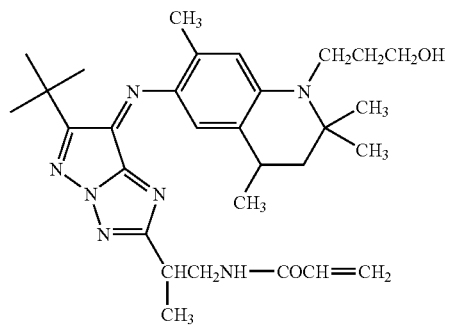
M-70
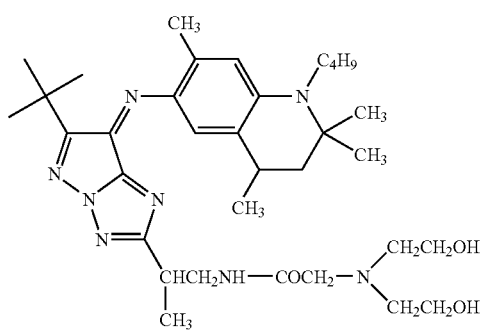
M-71
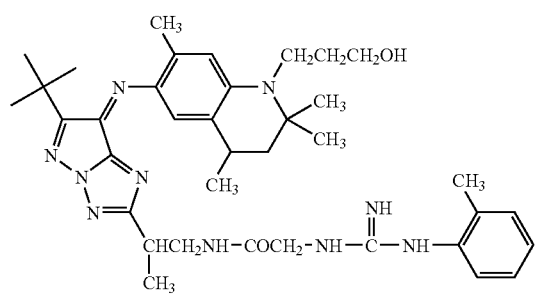
M-72
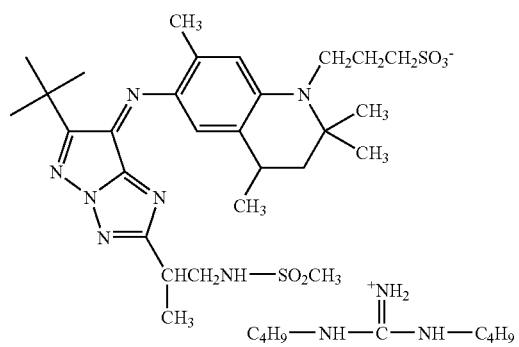
M-73

-continued
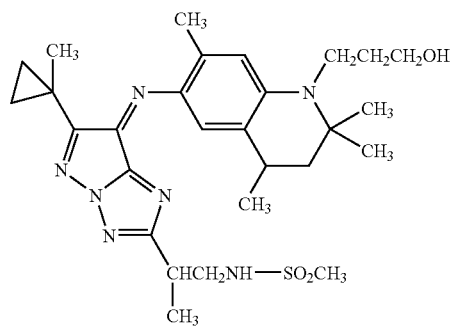
M-74
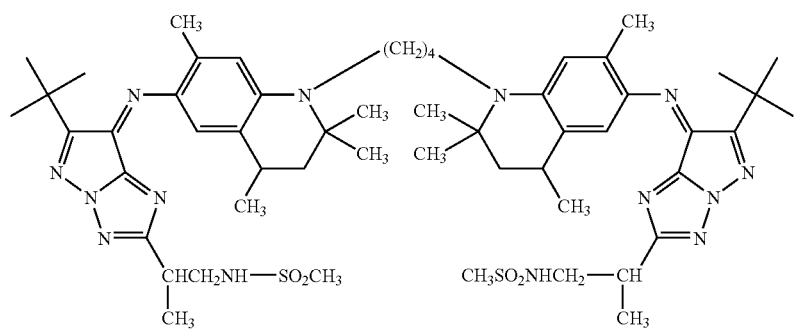
M-75
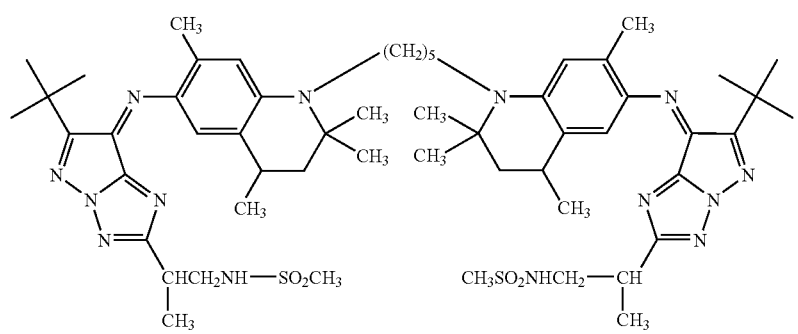
M-76
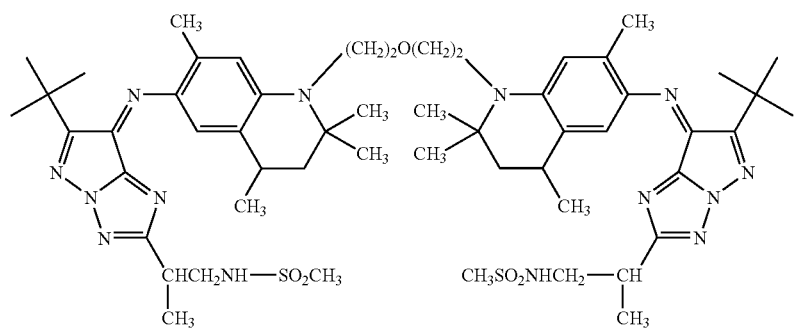
M-77

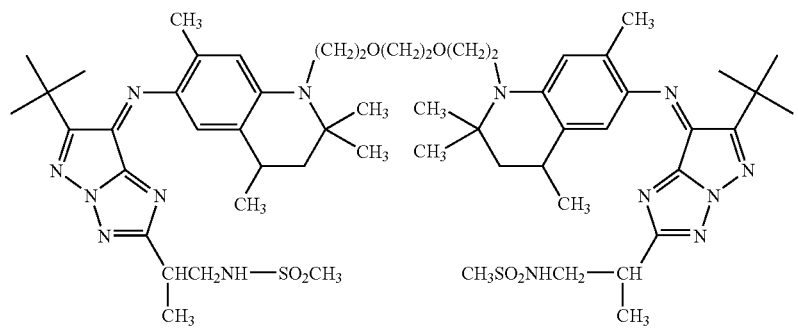
M-78
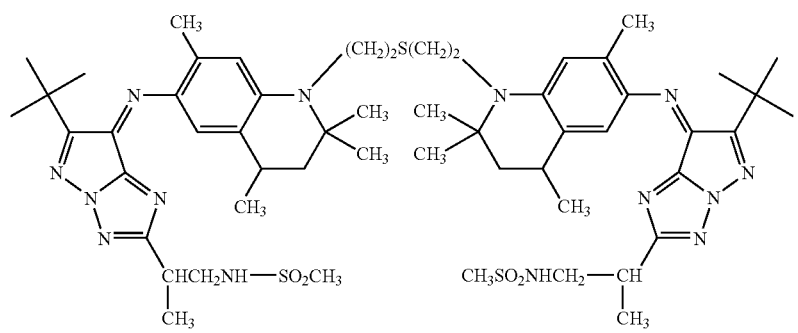
M-79
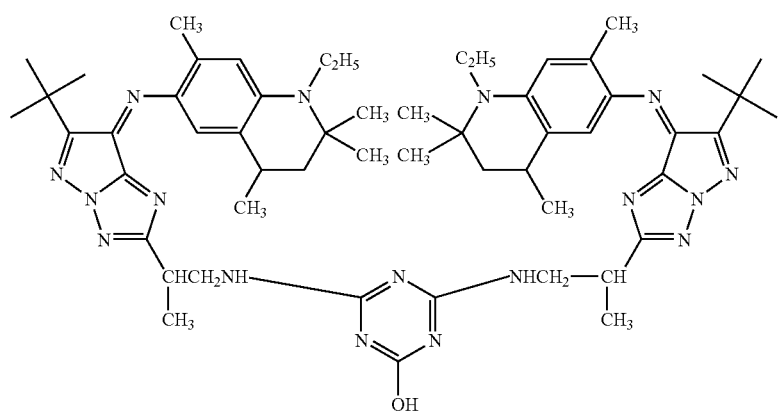
M-80
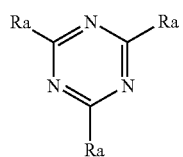

-continued
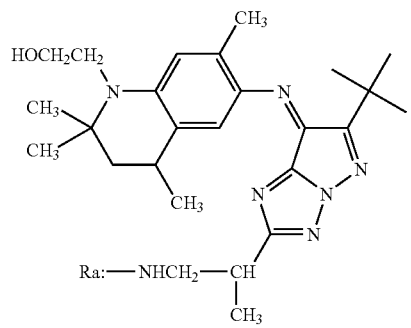
M-81
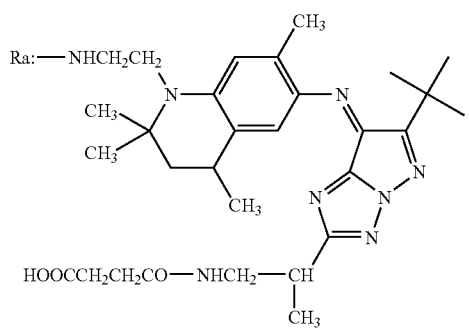
M-82
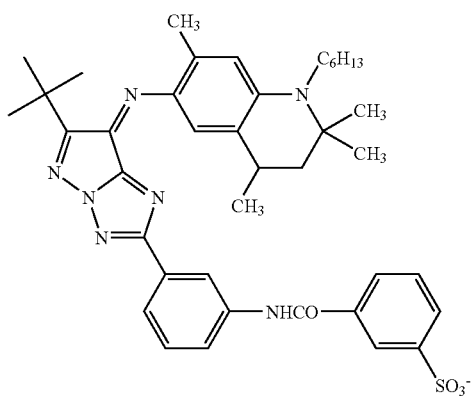
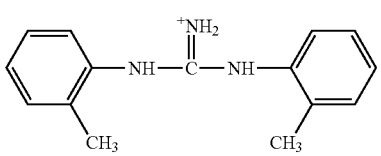
M-83

-continued

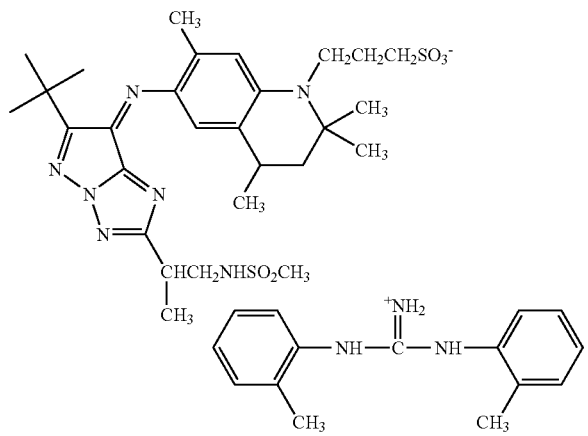

M-84

Next, a synthesis example of an azomethine dye represented by the formula (I) is described by exemplifying the synthesis example of the above-mentioned dye M-1 along with the following reaction scheme A. However, the synthesis is not limited to the example and dyes other than the exemplified dye M-1 may be obtained by similar methods.

SYNTHESIS EXAMPLE

Synthesis of Exemplified Dye M-1 reaction scheme A

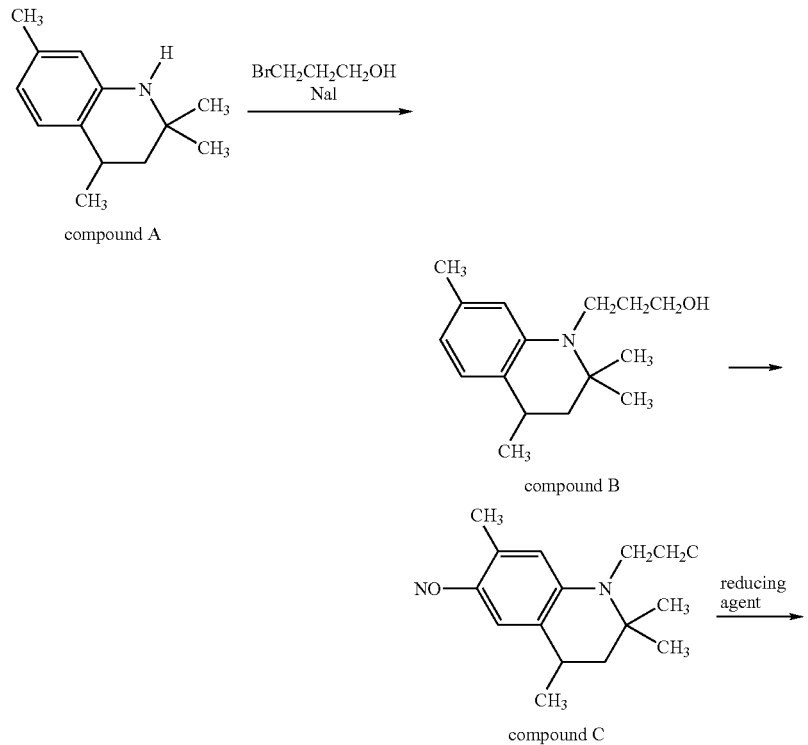

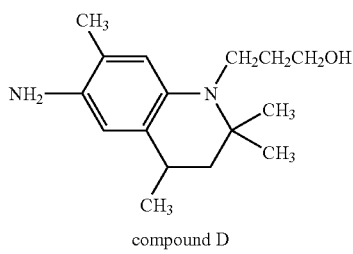

compound D

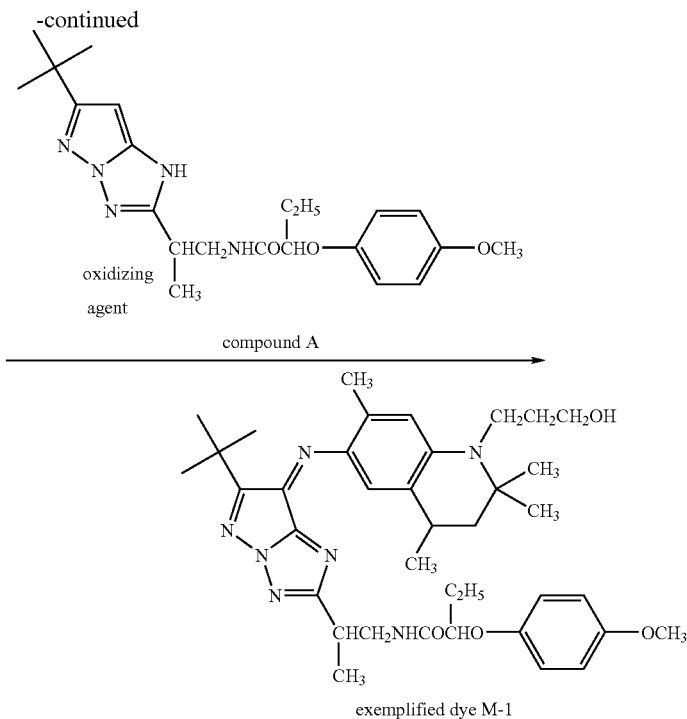

exemplified dye M-1

(1) Synthesis of Compound B

At first, 94.7 g (0.5 mole) of the compound A (manufactured by Sigma-Aldrich), 37.5 g (0.25 mole) of sodium iodide, and 126 g (1.5 mole) of sodium hydrogen carbonate and these are added with 30 ml of dimenthylimidazolizinon, and then the mixture is heated to 95° C. and stirred. To the obtained solution, 90.3 g (0.65 mole) of 3-bromopropanol is added dropwise. On completion of the dropwise addition, the obtained solution is heated at 95 to 100° C. for 5 hours and stirred to complete the reaction. On completion of the reaction, the reaction solution is cooled to a room temperature and 600 ml of water and 500 ml of ethyl acetate are added for extraction. After that, the obtained ethyl acetate solution is washed with water and dried by dehydrated magnesium sulfate. After the ethyl acetate solution is concentrated in reduced pressure, the produced product is refined by silica gel column chromatography (eluent solution:n-hexane/ethyl acetate=10/1) to obtain 90.5 g of the compound B (yield: 73.2%)

(2) Synthesis of Compound C

Successively, 270 ml of methanol is added to 90 g (0.364 mole) of the above obtained compound B and the obtained solution is cooled to 5° C. After 93.7 ml (1.09 mole) of concentrated hydrochloric acid is added dropwise to the solution, a solution obtained by dissolving 27.6 g (0.4 mole) of sodium nitrite in 75 ml of water is further added dropwise while the solution is kept at 5 to 10° C. On completion of dropwise addition, the reaction solution is stirred at 5 to 10° C. for 2 hours to complete the reaction. On completion of the reaction, 500 ml of ethyl acetate and 1000 ml of are added. After the resulting solution is neutralized by gradually added 84 g of sodium hydrogen carbonate, the water phase is removed. After the obtained ethyl acetate solution is washed with water, the solution is dried by dehydrated magnesium sulfate. When the ethyl acetate solution is concentrated in reduced pressure, a crystal is precipitated. The precipitated crystal is mixed with 200 ml of n-hexane and 200 ml of ethyl acetate and stirred to disperse the crystal. The crystal is filtered and dried to obtain 78 g of the compound C (yield: 77.6%).

(3) Synthesis of Compound E

Next, the compound E is synthesized by the method shown in the following scheme.

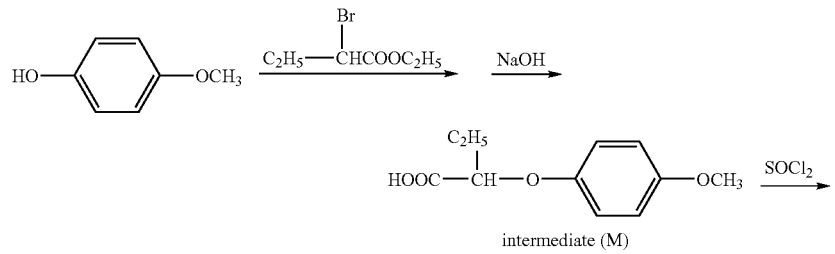

intermediate (M)

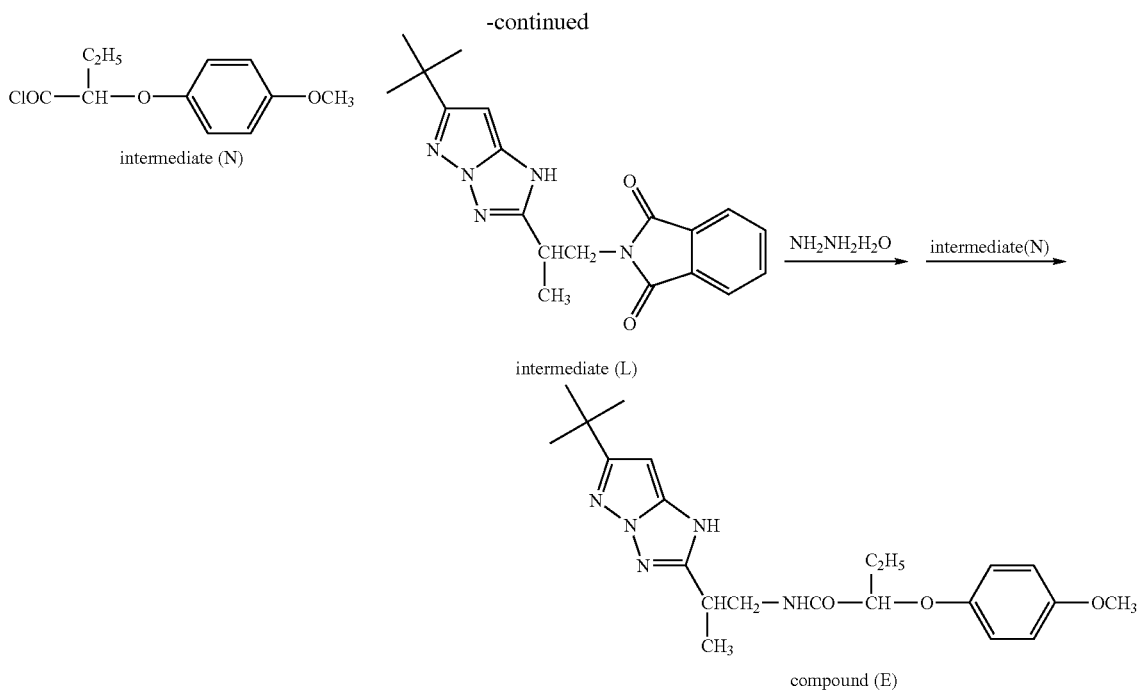

—Synthesis of Intermediate (M)—

600 ml of Dimethylacetamide is added to 112 g (0.9 mole) of 4-methoxyphenol and stirred at a room temperature. To the obtained solution, 196 ml of a methanol solution of 28% sodium methoxide is added. On completion of the addition, 190 g (0.97 mole) of ethyl 2-bromobutanate is added dropwise to the solution. On completion of the dropwise addition, the resulting solution is stirred at a room temperature for 3 hours to complete the reaction.

The reaction solution is mixed with 1000 ml of water and 1000 ml of ethyl acetate to extract the product with ethyl acetate. After the obtained ethyl acetate solution is washed with salt water, the residue left after distillation removal of the ethyl acetate in reduced pressure is mixed with 250 ml of methanol and stirred at a room temperature. To the obtained solution, an aqueous solution obtained by dissolving 144 g of sodium hydroxide in 1000 ml of water is added and successively the mixture is heated to 50 to 55° C. and stirred for 2 hours. On completion of the reaction, 340 ml of concentrated hydrochloric acid is added dropwise to the reaction solution to make the solution acidic. Next, 1000 ml of ethyl acetate is added for extraction and the obtained ethyl acetate solution is washed with salt water and successively dried with dehydrated sodium sulfate and the ethyl acetate solution is concentrated in reduced pressure to quantitatively obtain the intermediate (M).

—Synthesis of Intermediate (N)—

Successively, 400 ml of toluene is added to 93.1 g (0.433 mole) of the intermediate (M) obtained in the above-mentioned manner and the mixture is heated to 85 to 90° C. and stirred. To the solution, 50 ml of thionyl chloride is added dropwise and the mixture is heated and stirred fro 3 hours. On completion of the reaction, toluene and excess thionyl chloride are removed by distillation in reduced pressure. Next, after being cooled, the reaction product is mixed with 100 ml of ethyl acetate to obtain an ethyl acetate solution of the intermediate (N). The ethyl acetate solution of the intermediate (N) is used in the next step.

—Synthesis of Compound E—

According to a method described in JP-A No. 2-201443, an intermediate L is obtained by changing 5-amino-3-methylpyrazole to 5-amino-3-tert-butylpyrazole (synthesized by a method described in JP Patent No. 2,670,943)

To 189 g (0.538 mole) of the intermediate L, 570 ml of 2-propanol is added and the mixture is heated and stirred. Then, 33.6 g (0.673 mole) of hydrazine monohydrate is added dropwise to the obtained solution and the mixture is heated and stirred for 2 hours. On completion of the reaction, about 400 ml of 2-propanol is removed by distillation in reduced pressure. After that 420 g of sodium hydrogen carbonate, 1500 ml of water, and 1200 ml of ethyl acetate are added to the obtained residue and the mixture is stirred at a room temperature. Next, an ethyl acetate solution of the above-mentioned intermediate (N) is added dropwise to the solution and on completion of the dropwise addition, the reaction solution is stirred at a room temperature for 2 hours and water-phase is removed. The obtained ethyl acetate solution is washed with water to precipitate a crystal. To the dispersion, 1200 ml of n-hexane is added and stirred for 1 hour and then the crystal is separated by filtration, washed with water, and dried to obtain 159 g of the compound E (yield: 86.9%).

(4) Synthesis of Exemplified Coloring Material M-1

To 7.35 g (0.0266 mole) of the obtained compound C as described above, 50 ml methanol, 100 ml of ethyl acetate, and 100 ml of water are added and the mixture is heated at 40° C. and stirred. To the solution, 25 g of sodium hydrosulfite is gradually added and after the addition, reaction is carried out at 40° C. for 1 hour. On completion of the reaction, the reaction solution is cooled to a room temperature and 100 ml of ethyl acetate and 200 ml of water are added and water phase is removed to obtain an ethyl acetate solution containing the compound D. The obtained ethyl acetate solution is used in the next step.

Successively, 10.0 g (0.0242 mole) of the obtained compound E as described above, 21 g of sodium hydrogen carbonate, 100 ml of methanol, and 200 ml of water is added and stirred at a room temperature. The entire amount of the above-mentioned ethyl acetate solution is added to the resulting solution and further an aqueous solution obtained by dissolving 12 g of ammonium persulfate in 100 ml of water is added dropwise. On completion of the dropwise addition, reaction is carried out at a room temperature for 1 hour. On completion of the reaction, the formed water phase is removed and successively the obtained ethyl acetate solution is washed with water and concentrated in reduced pressure. Then, the residue is refined by silica gel column chromatography (eluent solution:n-hexane/ethyl acetate=1/1) to obtain amorphous-state exemplified coloring material M-1.

The obtained product is identified by a spectrophotometer UV-2500 PC (Shiimadzu Corp.) to find that the product has a maximum absorption at wavelength $\lambda max=556$ m and molar absorption coefficient $\epsilon=5,5000$ in the ethyl acetate solution.

<Tetraazporphyrin Dye Represented by Formula (A)>

The color curable composition of the invention contains at least one tetraazaporphyrin dye represented by the following formula (A). This dye is an organic solvent-soluble dye having desirable molar absorption coefficient $\epsilon$, and color value and a compound having both satisfactorily high light resistance and heat resistance, which a conventional dye has not had, and easy to be dissolved in water or a solvent if necessary.

The composition of the invention may contain at least one kind of tetrazaporphyrin represented by the formula (A) or may contain two or more kinds of tetrazaporphyrins in combination. The compounds represented by the formula (A) (the coloring material compounds according to the invention) include tautomers (hereinafter, the same).

Formula (A)

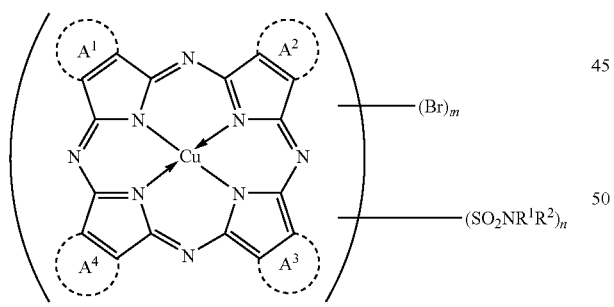

wherein ring $A^1$, ring $A^2$, ring $A^3$, and ring $A^4$ each independently represent the following formula(1) or formula(2) and at least one of ring $A^1$, ring $A^2$, ring $A^3$, and ring $A^4$ represents formula(2);

Formula (1)

Formula (2)

Specifically, as basic skeletons of the compound represented by the formula (A), the following five types of structures represented by the structural formulas (3) to (7) are exemplified and position isomers having different positions of N owing to the difference in the condensation direction of the pyridine ring exit. Further, isomers having substituent groups such as bromine at different positions also respectively exist.

(3)

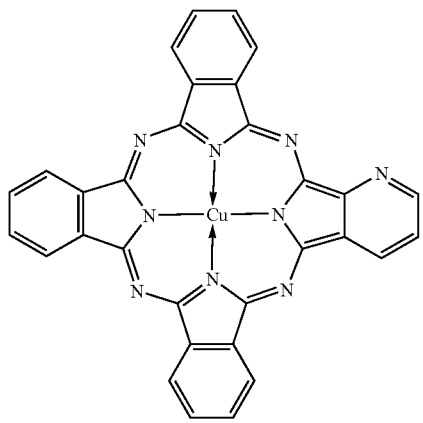

(4)

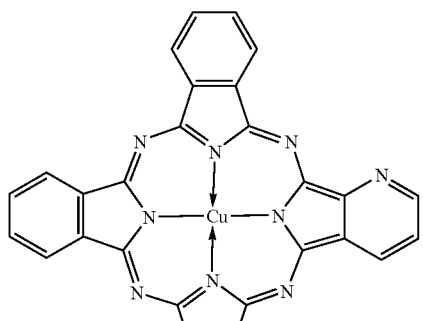

(5)

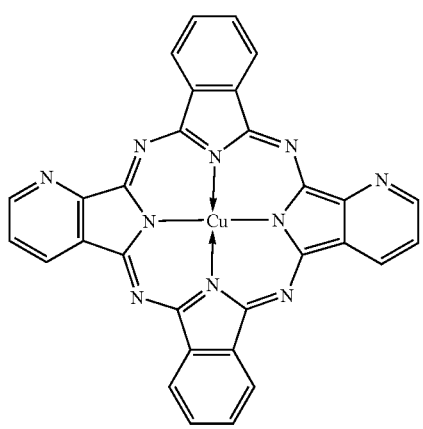

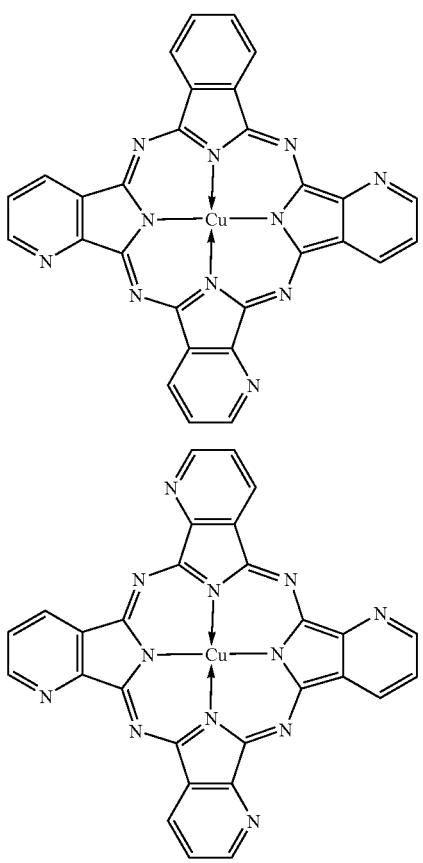

(6)

(7)

In the above-mentioned formula A, $R^1$ and $R^2$ each independently represent a hydrogen atom or a substituted or unsubstituted alkyl group, however $R^1$ and $R^2$ do not simultaneously represent hydrogen atoms; m represents an integer of 1 to 8; and n represents an integer of 1 to 4.

The unsubstituted alkyl group represented by $R^1$ and $R^2$ is preferably an alkyl group having 1 to 12 carbon atoms and examples of the alkyl group are straight or branched alkyl groups such as methyl ethyl, n-propyl, isopropyl, n-butyl, isobutyl, n-hexyl, 2-ethylhexyl, n-octyl, and n-dodecyl and among them straight or branched alkyl groups having 4 to 12 carbons are preferable.

The substituted alkyl group represented by $R^1$ and $R^2$ is preferably an alkyl group having 1 to 12 carbon atoms and an oxygen atom in the form of one of an ether bond, a carbonyl bond and an ester bond, and more preferably a branched or cyclic substituted alkyl group having 2 to 12 carbon atoms and 1 to 4 oxygen atoms in the form at least one of the above-mentioned bonds. Examples are methoxymethyl, ethoxymethyl, butoxymethyl, methoxyethyl, ethoxyethyl, 3-methoxypropyl, 3-ethoxypropyl, 3-butoxypropyl, methoxyethoxyethyl, ethoxyethoxyethyl, butoxyethoxyethyl, methoxyethoxyethoxyethyl, ethoxyethyoyethoxyethyl, butoxyethoxyethoxyethyl, acethylmethyl, acethylethyl, propionylmethyl, propionylethyl, tetrahydrofurfuryloxymethyl, 2,2-dimethyl-1,3-dioxolane-4-methoxymethyl, 2-(1,3-dioxolane)ethoxymethyl, 2-(1,3-dioxane)ethoxymethyl, methoxycarbonylmethyl, ethoxycarbonylethyl, propoxycarbonylethyl, butoxycarbonylethyl, pentoxycarbonylethyl, 1-(butoxymethyl)ethyl, 1-(methoxymethyl)propyl, 1-(ethoxymethyl)propyl, 1-(2-ethoxy-ethoxy-methyl)propyl, 1-(2-methoxy-2-ethoxy-2-ethoxymethyl)ethyl, 1-(2-ethoxy-2-ethoxy-2-ethoxymethyl)ethyl, 1-(2-butoxy-2-ethoxy-2-ethoxymethyl)ethyl, 1-(2-methoxy-2-ethoxy-2-ethoxymethyl)propyl, 1-(2-ethoxy-2-ethoxy-2-ethoxymethyl)propyl, 1-(2-propoxy-2-ethoxy-2-ethoxymethyl)propyl, 1-(2-butoxy-2-ethoxy-2-ethoxymethyl)propyl, 1-(2-methoxy-2-ethoxy-2-ethoxymethyl)butyl, 1-(2-ethoxy-2-ethoxy-2-ethoxymethyl)butyl, 1-(2-propoxy-2-ethoxy-2-ethoxymethyl)butyl, 1-(2-methoxy-2-ethoxy-2-ethoxymethyl)pentyl, 1-(2-ethoxy-2-ethoxy-2-ethoxymethyl)butyl, 1-(2-methoxy-2-ethoxy-2-ethoxymethyl)ethyl, 1-(2-ethoxy-2-ethoxy-2-ethoxymethyl)ethyl, 1-(2-methoxy-2-ethoxy-2-ethoxymethyl)propyl, 1-(2-ethoxy-2-ethoxy-2-ethoxymethyl)propyl, 1-(2-methoxy-2-ethoxy-2-ethoxymethyl)butyl, 1-(2-ethoxy-2-ethoxy-2-ethoxymethyl)butyl, 1-(2-methoxy-2-ethoxy-2-ethoxymethyl)ethyl, 1-(2-methoxy-2-ethoxy-2-ethoxyethyl)ethyl, 1-(2-methoxy-2-ethoxy-2-ethoxyethyl)propyl, 1,1-di(methoxymethyl)methyl, 1,1-di(ethoxymethyl)methyl, 1,1-di(propoxymethyl)methyl, 1,1-di(butoxymethyl)methyl, 1,1-di(2-methoxy-ethoxymethyl)methyl, 1,1-di(2-ethoxy-ethoxymethyl)methyl, 1,1-di(2-propoxy-ethoxymethyl)methyl, and 1,1-di(2-butoxy-ethoxymethyl)methyl group.

The above-mentioned $R^1$ and $R^2$ are preferable to independently represent a hydrogen atom (however $R^1$ and $R^2$ do not simultaneously represent hydrogen atoms), an unsubstituted alkyl group, or "a substituted alkyl group having an oxygen atom in the form of at least one of an ether bond, a carbonyl bond and an ester bond".

The above-mentioned $R^1$ and $R^2$ are more preferable to independently represent a hydrogen atom (however $R^1$ and $R^2$ do not simultaneously represent hydrogen atoms), an unsubstituted alkyl group having 1 to 12 carbon atoms, and a substituted alkyl group having 2 to 12 carbon atoms and 1 to 4 oxygen atoms in the form of at least one of an ether bond, a carbonyl bond and an ester bond. It is even more preferable that at least one of $R^1$ and $R^2$ is substituted alkyl group having 2 to 12 carbon atoms and 1 to 4 oxygen atoms in the form of at least one of an ether bond, a carbonyl bond and an ester bond from a viewpoint of the high solubility in a polar organic solvent.

Further, It is even more preferable that at least one of $R^1$ and $R^2$ is a substituted alkyl group having 2 to 12 carbon atoms and 1 to 4 oxygen atoms in the form of at least one of an ether bond, a carbonyl bond and an ester bond from a viewpoint of the high solubility in a polar organic solvent and particularly, it is preferable that at least one of $R^1$ and $R^2$ is a substituted alkyl group defined by the following formula (B) in a tetraazaporphyrin compound.

Formula (B)

In the above-mentioned formula (B), $R^3$ and $R^4$ each independently represent a hydrogen atom, an unsubstituted alkyl group having 1 to 12 carbon atoms, and an alkyl group having oxygen atoms in the form of at least one of an ether bond, a carbonyl bond and an ester, an alkylcarbonyl group, or an alkoxycarbonyl group. At least one of $R^3$ and $R^4$ is an alkyl group having oxygen atoms in the form of at least one of an ether bond, a carbonyl bond and an ester, an alkylcarbonyl group, or an alkoxycarbonyl group.

The unsubstituted alkyl group represented by $R^3$ and $R^4$ is preferably an alkyl group having 1 to 18 carbon atoms and examples are methyl, ethyl, propyl, isopropyl, butyl, isobutyl, pentyl, hexyl, and octyl group.

The substituted alkyl group having oxygen atoms in the form of at least one of an ether bond, a carbonyl bond and an ester represented by $R^3$ and $R^4$ is preferably an alkyl group having 1 to 4 oxygen atoms and 2 to 10 carbon atoms. Examples are methoxymethyl, ethoxymethyl, propoxymethyl, butoxymethyl, methoxyethoxymethyl, ethoxyethoxymethyl, propoxyethoxymethyl, butoxyethoxymethyl, methoxyethoxyethoxymethyl, ethoxyethoxyethoxymethyl, propoxyethoxyethoxymethyl, butoxyethoxyethoxymethyl, methoxyethoxyethoxyethoxymethyl, ethoxyethoxyethoxyethoxymethyl, butoxyethoxyethoxyethoxymethyl, acetylmethyl, propionylmethyl, tetrahydrofurfuryloxymethyl, 2,2-dimethyl-1,3-dioxolan-4-methoxymethyl, 2-(1,3-dioxolan)ethoxymethyl, 2-(1,3-dioxolan)ethoxymethyl, methoxycarbonylmethyl, ethoxycarbonylmethyl, propoxycarbonylmethyl, butoxycarbonylmethyl, and pentoxycarbonylmethyl group.

The alkylcarbonyl group and alkoxycarbonyl group represented by $R^3$ and $R^4$ are preferably an alkylcarbonyl group having 2 to 10 total carbon atoms and an alkoxycarbonyl group having 2 to 10 carbon atoms. Examples are acetyl, propionyl, propylcarbonyl, methoxycarbonyl, ethoxycarbonyl, propoxycarbonyl, butoxycarbonyl, and pentoxycarbonyl group.

In the above-mentioned formula (A), the reference character m represents an integer of 1 to 8, preferably an integer of 1 to 6, and more preferably an integer of 1 to 4 in terms of high absorbance. The reference character n represents an integer of 1 to 4, preferably 2 or 3, and more preferably 2.

The tetraazaporphyrin compounds represented by the above-mentioned formula (A) include some or all of these many isomers.

Hereinafter, compounds (specific examples 1 to 157) of the tetra porphyrin compound represented by the above-mentioned formula (A) are exemplified below. However, the invention should not be limited to these exemplified compounds.

| No. of specific example | No. of  | No. of 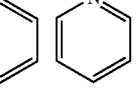 | m | n | $R^1$ | $R^2$ |
|---|---|---|---|---|---|---|
| 1 | 3 | 1 | 1 | 1 | H | —$C_2H_4OC_2H_5$ |
| 2 | 3 | 1 | 2 | 2 | H | —$C_2H_4OC_2H_5$ |
| 3 | 3 | 1 | 3 | 3 | H | —$C_2H_4OC_2H_5$ |
| 4 | 3 | 1 | 1 | 4 | H | —$C_2H_4OC_2H_5$ |
| 5 | 3 | 1 | 1 | 1 | —$C_2H_4OC_2H_5$ | —$C_2H_4OC_2H_5$ |
| 6 | 3 | 1 | 1 | 1 | H | —$C_3H_6OC_4H_9$ |
| 7 | 3 | 1 | 1 | 2 | H | —$C_3H_6OC_4H_9$ |
| 8 | 3 | 1 | 1 | 3 | H | —$C_3H_6OC_4H_9$ |
| 9 | 3 | 1 | 1 | 4 | H | —$C_3H_6OC_4H_9$ |
| 10 | 3 | 1 | 1 | 1 | —$C_2H_4OCH_3$ | —$C_2H_4OCH_3$ |
| 11 | 3 | 1 | 1 | 2 | —$C_2H_4OCH_3$ | —$C_2H_4OCH_3$ |
| 12 | 3 | 1 | 1 | 3 | —$C_2H_4OCH_3$ | —$C_2H_4OCH_3$ |
| 13 | 3 | 1 | 1 | 4 | —$C_2H_4OCH_3$ | —$C_2H_4OCH_3$ |
| 14 | 3 | 1 | 1 | 2 | —$C_4H_9$ | —$C_4H_9$ |
| 15 | 3 | 1 | 1 | 1 | H | —$CH_2$—$CH(C_2H_5)$—$C_4H_9$ |
| 16 | 3 | 1 | 1 | 2 | H | —$CH_2$—$CH(C_2H_5)$—$C_4H_9$ |
| 17 | 3 | 1 | 1 | 3 | H | —$CH_2$—$CH(C_2H_5)$—$C_4H_9$ |
| 18 | 3 | 1 | 1 | 4 | H | —$CH_2$—$CH(C_2H_5)$—$C_4H_9$ |
| 19 | 3 | 1 | 1 | 1 | H | —$C_3H_6$—$OCH_2$—$CH(C_2H_5)$—$C_4H_9$ |
| 20 | 3 | 1 | 1 | 2 | H | —$C_3H_6$—$OCH_2$—$CH(C_2H_5)$—$C_4H_9$ |

-continued

| No. of specific example | No. of ⌬ | No. of N-ring | m | n | R¹ | R² |
|---|---|---|---|---|---|---|
| 21 | 3 | 1 | 1 | 3 | H | —$C_3H_6$—$OCH_2$—CH(—$C_2H_5$)—$C_4H_9$ |
| 22 | 3 | 1 | 4 | 2 | H | —$C_3H_6$—$OCH_2$—CH(—$C_2H_5$)—$C_4H_9$ |
| 23 | 3 | 1 | 5 | 2 | H | —$C_2H_4OC_2H_4OC_2H_5$ |
| 24 | 3 | 1 | 6 | 1 | —$C_2H_5$ | —$C_2H_4OC_2H_5$ |
| 25 | 3 | 1 | 8 | 1 | -i-$C_3H_7$ | —$CH_2O$—$C_2H_4$—(1,3-dioxane) |
| 26 | 3 | 1 | 3 | 2 | H | —CH($C_2H_5$)—$CH_2OCH_3$ |
| 27 | 3 | 1 | 1 | 1 | H | —CH($C_2H_5$)—$CH_2OC_2H_4OC_2H_5$ |
| 28 | 3 | 1 | 1 | 2 | H | —CH($C_2H_5$)—$CH_2OC_2H_4OC_2H_5$ |
| 29 | 3 | 1 | 2 | 2 | H | —CH($C_2H_5$)—$CH_2OC_2H_4OC_2H_5$ |
| 30 | 3 | 1 | 3 | 2 | H | —CH($C_2H_5$)—$CH_2OC_2H_4OC_2H_5$ |
| 31 | 3 | 1 | 1 | 1 | H | —CH(i-$C_3H_7$)—$COOCH_3$ |
| 32 | 3 | 1 | 1 | 2 | H | —CH(i-$C_3H_7$)—$COOCH_3$ |
| 33 | 3 | 1 | 1 | 2 | H | —CH(i-$C_3H_7$)—$COOCH_3$ |
| 34 | 3 | 1 | 1 | 1 | H | —CH(i-$C_3H_7$)—$COOCH_3$ |
| 35 | 3 | 1 | 3 | 2 | -n-$C_8H_{17}$ | —CH($C_2H_5$)—$CH_2OC_2H_4OC_2H_5$ |
| 36 | 3 | 1 | 4 | 2 | H | —CH($COOC_2H_4OC_2H_5$)—$CHCOOC_2H_4OC_2H_5$ |
| 37 | 3 | 1 | 1 | 1 | —$C_2H_4OC_2H_4OC_2H_5$ | —$C_2H_4OC_2H_4OC_2H_5$ |
| 38 | 2 | 2 | 1 | 1 | H | —$C_2H_4OC_2H_5$ |
| 39 | 2 | 2 | 1 | 2 | H | —$C_2H_4OC_2H_5$ |
| 40 | 2 | 2 | 1 | 3 | H | —$C_2H_4OC_2H_5$ |
| 41 | 2 | 2 | 1 | 4 | H | —$C_2H_4OC_2H_5$ |
| 42 | 2 | 2 | 1 | 2 | —$C_2H_4OC_2H_5$ | —$C_2H_4OC_2H_5$ |
| 43 | 2 | 2 | 1 | 1 | H | —$C_3H_6OC_4H_9$ |
| 44 | 2 | 2 | 1 | 2 | H | —$C_3H_6OC_4H_9$ |

-continued

| No. of specific example | No. of ⌬ | No. of (pyridine) | m | n | R¹ | R² |
|---|---|---|---|---|---|---|
| 45 | 2 | 2 | 1 | 3 | H | —$C_3H_6OC_4H_9$ |
| 46 | 2 | 2 | 1 | 4 | H | —$C_3H_6OC_4H_9$ |
| 47 | 2 | 2 | 1 | 1 | —$C_2H_4OCH_3$ | —$C_2H_4OCH_3$ |
| 48 | 2 | 2 | 1 | 2 | —$C_2H_4OCH_3$ | —$C_2H_4OCH_3$ |
| 49 | 2 | 2 | 1 | 3 | —$C_2H_4OCH_3$ | —$C_2H_4OCH_3$ |
| 50 | 2 | 2 | 1 | 4 | —$C_2H_4OCH_3$ | —$C_2H_4OCH_3$ |
| 51 | 2 | 2 | 1 | 3 | —$C_4H_9$ | —$C_4H_9$ |
| 52 | 2 | 2 | 1 | 1 | H | —$CH_2$—$CH(C_2H_5)$—$C_4H_9$ |
| 53 | 2 | 2 | 1 | 2 | H | —$CH_2$—$CH(C_2H_5)$—$C_4H_9$ |
| 54 | 2 | 2 | 1 | 3 | H | —$CH_2$—$CH(C_2H_5)$—$C_4H_9$ |
| 55 | 2 | 2 | 1 | 4 | H | —$CH_2$—$CH(C_2H_5)$—$C_4H_9$ |
| 56 | 2 | 2 | 1 | 1 | H | —$C_3H_6$—$OCH_2$—$CH(C_2H_5)$—$C_4H_9$ |
| 57 | 2 | 2 | 1 | 2 | H | —$C_3H_6$—$OCH_2$—$CH(C_2H_5)$—$C_4H_9$ |
| 58 | 2 | 2 | 1 | 3 | H | —$C_3H_6$—$OCH_2$—$CH(C_2H_5)$—$C_4H_9$ |
| 59 | 2 | 2 | 1 | 4 | H | —$C_3H_6$—$OCH_2$—$CH(C_2H_5)$—$C_4H_9$ |
| 60 | 2 | 2 | 1 | 4 | H | —$C_2H_4OC_2H_4OC_2H_5$ |
| 61 | 2 | 2 | 1 | 1 | —$C_2H_5$ | —$C_2H_4OC_2H_5$ |
| 62 | 2 | 2 | 2 | 2 | -i-$C_3H_7$ | —$CH_2O$—$C_2H_4$—(1,3-dioxane-2-yl) |
| 63 | 2 | 2 | 3 | 3 | H | —$CH(C_2H_5)$—$CH_2OCH_3$ |
| 64 | 2 | 2 | 1 | 1 | H | —$CH(C_2H_5)$—$CH_2OC_2H_4OC_2H_5$ |
| 65 | 2 | 2 | 1 | 2 | H | —$CH(C_2H_5)$—$CH_2OC_2H_4OC_2H_5$ |
| 66 | 2 | 2 | 3 | 3 | H | —$CH(C_2H_5)$—$CH_2OC_2H_4OC_2H_5$ |
| 67 | 2 | 2 | 1 | 4 | H | —$CH(C_2H_5)$—$CH_2OC_2H_4OC_2H_5$ |

-continued

| No. of specific example | No. of ⬡ | No. of N⬡ | m | n | R¹ | R² |
|---|---|---|---|---|---|---|
| 68 | 2 | 2 | 1 | 1 | H | —CH(i-C$_3$H$_7$)—COOCH$_3$ |
| 69 | 2 | 2 | 2 | 2 | H | —CH(i-C$_3$H$_7$)—COOCH$_3$ |
| 70 | 2 | 2 | 3 | 3 | H | —CH(i-C$_3$H$_7$)—COOCH$_3$ |
| 71 | 2 | 2 | 1 | 4 | H | —CH(i-C$_3$H$_7$)—COOCH$_3$ |
| 72 | 2 | 2 | 1 | 4 | -n-C$_8$H$_{17}$ | —CH(C$_2$H$_5$)—CH$_2$OC$_2$H$_4$OC$_2$H$_5$ |
| 73 | 2 | 2 | 1 | 1 | H | —CH(COOC$_2$H$_4$OC$_2$H$_5$)—COOC$_2$H$_4$OC$_2$H$_5$ |
| 74 | 2 | 2 | 2 | 2 | —C$_2$H$_4$OC$_2$H$_4$OC$_2$H$_5$ | —C$_2$H$_4$OC$_2$H$_4$OC$_2$H$_5$ |
| 75 | 1 | 3 | 1 | 1 | H | —C$_2$H$_4$OC$_2$H$_5$ |
| 76 | 1 | 3 | 2 | 2 | H | —C$_2$H$_4$OC$_2$H$_5$ |
| 77 | 1 | 3 | 1 | 3 | H | —C$_2$H$_4$OC$_2$H$_5$ |
| 78 | 1 | 3 | 1 | 4 | H | —C$_2$H$_4$OC$_2$H$_5$ |
| 79 | 1 | 3 | 1 | 3 | —C$_2$H$_4$OC$_2$H$_5$ | —C$_2$H$_4$OC$_2$H$_5$ |
| 80 | 1 | 3 | 1 | 1 | H | —C$_3$H$_6$OC$_4$H$_9$ |
| 81 | 1 | 3 | 1 | 2 | H | —C$_3$H$_6$OC$_4$H$_9$ |
| 82 | 1 | 3 | 1 | 3 | H | —C$_3$H$_6$OC$_4$H$_9$ |
| 83 | 1 | 3 | 1 | 4 | H | —C$_3$H$_6$OC$_4$H$_9$ |
| 84 | 1 | 3 | 1 | 1 | —C$_2$H$_4$OCH$_3$ | —C$_2$H$_4$OCH$_3$ |
| 85 | 1 | 3 | 1 | 2 | —C$_2$H$_4$OCH$_3$ | —C$_2$H$_4$OCH$_3$ |
| 86 | 1 | 3 | 1 | 3 | —C$_2$H$_4$OCH$_3$ | —C$_2$H$_4$OCH$_3$ |
| 87 | 1 | 3 | 1 | 4 | —C$_2$H$_4$OCH$_3$ | —C$_2$H$_4$OCH$_3$ |
| 88 | 1 | 3 | 1 | 4 | —C$_4$H$_9$ | —C$_4$H$_9$ |
| 89 | 1 | 3 | 1 | 1 | H | —CH$_2$—CH(C$_2$H$_5$)—C$_4$H$_9$ |
| 90 | 1 | 3 | 1 | 2 | H | —CH$_2$—CH(C$_2$H$_5$)—C$_4$H$_9$ |
| 91 | 1 | 3 | 1 | 3 | H | —CH$_2$—CH(C$_2$H$_5$)—C$_4$H$_9$ |
| 92 | 1 | 3 | 1 | 4 | H | —CH$_2$—CH(C$_2$H$_5$)—C$_4$H$_9$ |
| 93 | 1 | 3 | 1 | 1 | H | —C$_3$H$_6$—OCH$_2$—CH(C$_2$H$_5$)—C$_4$H$_9$ |
| 94 | 1 | 3 | 1 | 2 | H | —C$_3$H$_6$—OCH$_2$—CH(C$_2$H$_5$)—C$_4$H$_9$ |
| 95 | 1 | 3 | 1 | 3 | H | —C$_3$H$_6$—OCH$_2$—CH(C$_2$H$_5$)—C$_4$H$_9$ |

-continued

| No. of specific example | No. of benzene | No. of pyridine | m | n | R¹ | R² |
|---|---|---|---|---|---|---|
| 96 | 1 | 3 | 1 | 4 | H | —C$_3$H$_6$—OCH$_2$—CH(C$_2$H$_5$)—C$_4$H$_9$ |
| 97 | 1 | 3 | 1 | 1 | H | —C$_2$H$_4$OC$_2$H$_4$OC$_2$H$_5$ |
| 98 | 1 | 3 | 1 | 2 | —C$_2$H$_5$ | —C$_2$H$_4$OC$_2$H$_5$ |
| 99 | 1 | 3 | 3 | 3 | -i-C$_3$H$_7$ | —CH$_2$O—C$_2$H$_4$-(1,3-dioxane) |
| 100 | 1 | 3 | 1 | 4 | H | —CH(C$_2$H$_5$)—CH$_2$OCH$_3$ |
| 101 | 1 | 3 | 1 | 1 | H | —CH(C$_2$H$_5$)—CH$_2$OC$_2$H$_4$OC$_2$H$_5$ |
| 102 | 1 | 3 | 4 | 2 | H | —CH(C$_2$H$_5$)—CH$_2$OC$_2$H$_4$OC$_2$H$_5$ |
| 103 | 1 | 3 | 4 | 3 | H | —CH(C$_2$H$_5$)—CH$_2$OC$_2$H$_4$OC$_2$H$_5$ |
| 104 | 1 | 3 | 4 | 3 | H | —CH(C$_2$H$_5$)—CH$_2$OC$_2$H$_4$OC$_2$H$_5$ |
| 105 | 1 | 3 | 1 | 1 | H | —CH$_2$—C$_2$H$_4$COCH$_3$ |
| 106 | 1 | 3 | 2 | 2 | H | —CH$_2$—C$_2$H$_4$COCH$_3$ |
| 107 | 1 | 3 | 3 | 3 | H | —CH$_2$—C$_2$H$_4$COC$_3$H$_7$ |
| 108 | 1 | 3 | 1 | 4 | H | —CH$_2$—C$_2$H$_4$COC$_3$H$_7$ |
| 109 | 1 | 3 | 1 | 1 | -n-C$_8$H$_{17}$ | —CH(C$_2$H$_5$)—CH$_2$OC$_2$H$_4$OC$_2$H$_5$ |
| 110 | 1 | 3 | 2 | 2 | H | —CH(COOC$_2$H$_4$OC$_2$H$_5$)—COOC$_2$H$_4$OC$_2$H$_5$ |
| 111 | 1 | 3 | 1 | 3 | —C$_2$H$_4$OC$_2$H$_4$OC$_2$H$_5$ | —C$_2$H$_4$OC$_2$H$_4$OC$_2$H$_5$ |
| 112 | 0 | 4 | 1 | 1 | H | —C$_2$H$_4$OC$_2$H$_5$ |
| 113 | 0 | 4 | 1 | 2 | H | —C$_2$H$_4$OC$_2$H$_5$ |
| 114 | 0 | 4 | 1 | 3 | H | —C$_2$H$_4$OC$_2$H$_5$ |
| 115 | 0 | 4 | 1 | 4 | H | —C$_2$H$_4$OC$_2$H$_5$ |
| 116 | 0 | 4 | 1 | 4 | —C$_2$H$_4$OC$_2$H$_5$ | —C$_2$H$_4$OC$_2$H$_5$ |
| 117 | 0 | 4 | 1 | 1 | H | —C$_3$H$_6$OC$_4$H$_9$ |
| 118 | 0 | 4 | 1 | 2 | H | —C$_3$H$_6$OC$_4$H$_9$ |
| 119 | 0 | 4 | 1 | 3 | H | —C$_3$H$_6$OC$_4$H$_9$ |
| 120 | 0 | 4 | 1 | 4 | H | —C$_3$H$_6$OC$_4$H$_9$ |
| 121 | 0 | 4 | 1 | 1 | —C$_2$H$_4$OCH$_3$ | —C$_2$H$_4$OCH$_3$ |
| 122 | 0 | 4 | 1 | 2 | —C$_2$H$_4$OCH$_3$ | —C$_2$H$_4$OCH$_3$ |
| 123 | 0 | 4 | 1 | 3 | —C$_2$H$_4$OCH$_3$ | —C$_2$H$_4$OCH$_3$ |
| 124 | 0 | 4 | 1 | 4 | —C$_2$H$_4$OCH$_3$ | —C$_2$H$_4$OCH$_3$ |
| 125 | 0 | 4 | 1 | 1 | —C$_4$H$_9$ | —C$_4$H$_9$ |
| 126 | 0 | 4 | 1 | 1 | H | —CH$_2$—CH(C$_2$H$_5$)—C$_4$H$_9$ |
| 127 | 0 | 4 | 1 | 2 | H | —CH$_2$—CH(C$_2$H$_5$)—C$_4$H$_9$ |

-continued

| No. of specific example | No. of ⌬ | No. of N⌬ | m | n | R¹ | R² |
|---|---|---|---|---|---|---|
| 128 | 0 | 4 | 1 | 3 | H | —CH₂—CH(C₂H₅)—C₄H₉ |
| 129 | 0 | 4 | 1 | 4 | H | —CH₂—CH(C₂H₅)—C₄H₉ |
| 130 | 0 | 4 | 1 | 1 | H | —CHCOCH₃ |
| 131 | 0 | 4 | 1 | 2 | H | —CHCOCH₃ |
| 132 | 0 | 4 | 1 | 3 | H | —CHCOOC₃H₇ |
| 133 | 0 | 4 | 1 | 4 | H | —CHOOOC₃H₇ |
| 134 | 0 | 4 | 1 | 2 | H | —C₂H₄OC₂H₄OC₂H₅ |
| 135 | 0 | 4 | 1 | 3 | —C₂H₅ | —C₂H₄OC₂H₅ |
| 136 | 0 | 4 | 1 | 4 | -i-C₃H₇ | —CH₂O—C₂H₄—(1,3-dioxane) |
| 137 | 0 | 4 | 1 | 1 | H | —CH(C₂H₅)—CH₂OCH₃ |
| 138 | 0 | 4 | 1 | 1 | H | —CH(C₂H₅)—CH₂OC₂H₄OC₂H₅ |
| 139 | 0 | 4 | 1 | 2 | H | —CH(C₂H₅)—CH₂OC₂H₄OC₂H₅ |
| 140 | 0 | 4 | 1 | 3 | H | —CH(C₂H₅)—CH₂OC₂H₄OC₂H₅ |
| 141 | 0 | 4 | 1 | 4 | H | —CH(C₂H₅)—CH₂OC₂H₄OC₂H₅ |
| 142 | 0 | 4 | 1 | 1 | H | —CH(i-C₃H₇)—COOCH₃ |
| 143 | 0 | 4 | 1 | 2 | H | —CH(i-C₃H₇)—COOCH₃ |
| 144 | 0 | 4 | 1 | 3 | H | —CH(i-C₃H₇)—COOCH₃ |
| 145 | 0 | 4 | 1 | 2 | H | —CH(i-C₃H₇)—COOCH₃ |
| 146 | 0 | 4 | 1 | 2 | -n-C₈H₁₇ | —CH(C₂H₅)—CH₂OC₂H₄OC₂H₅ |
| 147 | 0 | 4 | 1 | 3 | H | —CH(COOC₂H₄OC₂H₅)—COOC₂H₄OC₂H₅ |
| 148 | 0 | 4 | 1 | 4 | —C₂H₄OC₂H₄OC₂H₅ | —C₂H₄OC₂H₄OC₂H₅ |

Production Method of Tetraazaporphorin Compound Defined by the Formula (A)

Hereinafter, a production method of a tetraazaporphyrin compound represented by the above-mentioned formula (A) will be described. An outline of typical production method is as follows.

(1) A basic skeleton of bromo-substituted tetraazaporphyrin compound is produced by causing reaction of a mixture containing compounds properly selected from a group consisting of phthalic acid, bromo-phthalic acid, pyridine-2,3-dicarboxylic acid, and bromo-pyridine-2,3-dicarboxylic acid.

(2) Next, the obtained compound is chlorosulfonylated.

(3) The obtained chlorosulfonyl compound of the bromo-substituted tetraazaporphyrin compound is reacted with an amine for amidation.

As another synthesis method; a tetraazaporphyrin compound is synthesized by causing reaction of a mixture containing phthalic acid and pyridine-2,3-dicarboxylic acid and either successively carrying out chlorosulfonylation, amidation and then bromination of the produced tetraazaporphyrin compound or successively carrying out bromination, then chlorosulfonylation and amidation of the produced tetraazaporphyrin compound.

Next, the above-mentioned production method will be described more in detail.

The above-mentioned (1) is a process of forming bromo-substituted tetraazaporphyrin ring and a method of forming the tetraazaporphyrin ring involves heating a mixture containing compounds properly selected from a group consisting of phthalic acid, bromo-substituted phthalic acid, pyridine-2,3-dicarboxylic acid, and bromo-pyridine-2,3-dicarboxylic acid with copper powder, copper oxide, or a copper salt at 120 to 300° C. in the presence of ammonia gas, an ammonium compound, or urea and as a catalyst, ammonium molybdate or the like without a solvent or in a solvent such as tetralin, 1-chloronaphthaline, nitrobenzene, trichlorobenzene, and DMI.

The component ratio (mole ratio) of the respective components in the mixture containing phthalic acid (A), bromo-substituted phthalic acid (B), pyridine-2,3-dicarboxylic acid (C), and bromo-substituted pyridine-2,3-dicarboxylic acid (D) to be used for the method of forming the ring is preferably (A)+(B):(C)+(D) in a range of (3.5:0.5) to (0:4); more preferably in a range of (3:1) to (0.5:3.5); and even more preferably in a range of (3:1) to (1:3) and preferably (A)+(C):(B)+(D) in a range of (3.5:0.5) to (0 to 4); more preferably in a range of (3:1) to (0.5:3.5); and even more preferably in a range of (3:1) to (1:3).

Phthalic acid, bromo-substituted phthalic acid, pyridine-2,3-dicarboxylic acid, and bromo-pyridine-2,3-dicarboxylic acid may be in form of dicyano compounds or anhydrides to be used. Specific examples of bromo-substituted phthalic acid are 3-bromophthalic acid, 4-bromophthalic acid, 3,4,5,6-tetrabromophthalic acid. Specific examples of bromo-pyridine-2,3-dicarboxylic acid are 5-bromopyridine-2,3-dicarboxylic acid and 6-bromopyridine-2,3-dicarboxylic acid.

The above-mentioned (2) is a chlorosulfonylation process of carrying out chlorosulfonylation by adding the obtained bromo-substituted tetraazaporphyrin compound little by little to chlorosulfonic acid in an amount of 5 to 20 times as much while the temperature is kept at 20° C. or lower: stirring at the temperature for 1 hour and carrying out a reaction at 155 to 160° C. for 4 hours: cooling the reaction system to 80° C. and adding dropwise thionyl chloride in an amount of 2 to 5 times as much as that of tetraazaporphyrin compound for 1 to 2 hours while the temperature is kept at 70 to 80° C.: stirring at the temperature for 2 to 10 hours, cooling to 15 to 20° C., and stirred for 12 hours at the temperature: discharging the obtained reaction solution little by little to ice water in an amount of 50 to 200 times as much as the weight of the used chlorosulfonic acid and filtering the precipitated product and washing the product with ice water until it becomes neutral to finally obtain the sulfonyl chloride of the bromo-substituted tetraazaporphyrin compound.

The above-mentioned reaction conditions are mainly for obtaining tetrasulfonyl chloride, however in the case of obtaining mono-, di, or tri-substituted sulfonylchloride, it may be possible to more moderate the reaction conditions in the chlorosulfonic acid. That is, the reaction temperature is lowered or the reaction time is shortened.

The above-mentioned (3) is a sulfone-amidation process of carrying out amidation by suspending the sulfonyl chloride of the bromo-substituted tetraazaporphyrin compound obtained in the above-mentioned (2) process in ice water: adding dropwise an organic amine compound defined by $NHR^1R^2$ (in the formula, $R^1$ and $R^2$ are the same as $R^1$ and $R^2$ defined in the above-mentioned formula (A)) (in an amount 2 to 8 times as much as the amount by mole of the bromo substituted tetraazaporphyrin compound) while the the temperature is kept at 15° C. or lower; stirring the reaction solution at 20 to 30° C. for 15 to 24 hours on completion of the dropwise addition; and filtering, water-washing, and drying the obtained product to obtain the tetraazaporphyrin compound.

The product obtained in the above-mentioned manner is often a mixture of a plurality of the above-mentioned isomers and the mixture is also within a scope of the invention and even the mixture can be effective as the invention.

In the case of the mixture, if necessary, the product may be refined by recrystallization with an organic solvent such as ethyl acetate, acetone, or methanol and further by a normal refining method such as column chromatography to obtain an isolated compound.

A plurality of the compounds (the colorants) represented by the formula (A) may be used and the compounds may be used in combination with another kind colorant, or with another colorant together with a salt of a metal or a nitrogen-containing compound, a complex, or with another colorant derivative.

The colored curable composition of the invention may contain one or more kinds of azomethine dyes represented by the above-mentioned formulas (I) to (III) in combination as the colorant and also one or more kinds of tetraazaporphyrin dyes represented by the above-mentioned formula (A) in combination. Further, conventionally known colorants can be used in combination and conventionally known dyes may include xanthene dyes and triarylmethane dyes.

In the invention, an azomethine dye represented by the formulas (I) to (III) and a tetraazaporphyrin dye represented by the formula (A) are used in combination and an azomethine dye represented by the formula (II) and a tetraazaporphyrin dye represented by the formula (A) are preferable to be used in combination.

Although it is different depending on the molecular weight and molar absorption coefficient ϵ, the concentration of the dye compound of the color curable composition in the invention is preferably 0.5 to 80% by weight, more preferably 0.5 to 60% by weight, and even more preferably 0.5 to 50% by weight in the total solid matter of the composition.

Although it is different depending on the respective molecular weights and molar absorption coefficients ϵ, the content ratio [formula (I)/formula (A)] of the azomethine dye represented by the formula (I) (including the dye represented by the formulas (II) and (III)) and the tetraazaporphyrin dye represented by the formula (A) is preferably (1/9) to (9/1), more preferably (1/4) to (4/1), and even more preferably (1/4) to (2/1).

<Binder>

The colored curable composition of the invention can be constituted preferably by using at least one binder. A binder usable for the invention is not particularly limited if it is alkali-soluble, however it is preferably selected in accordance with the heat resistance, developability, and availability.

As a binder soluble in an alkali (an alkali-soluble binder) is preferably a linear organic high molecular weight polymer soluble in an organic solvent and developable in an aqueous weakly alkaline solution. Examples of the linear organic high molecular weight polymer soluble in an organic solvent and developable in an aqueous weakly alkaline solution are polymers having carboxylic acid in the side chains, e.g. methacrylic acid copolymers, acrylic acid copolymers, itaconic acid copolymers, crotonic acid copolymers, maleic acid copolymers, and partially esterified maleic acid copolymers described in JP-A No. 59-44615, Japanese Patent Application Publication (JP-B) Nos. 54-34327, 58-12577, 54-25957, and JP-A Nos. 59-53836 and 59-71048 and similarly acidic cellulose derivatives having carboxylic acid are also useful. Besides, addition products obtained by adding acid anhydrides to polymers having hydroxyl groups, polyhydroxystyrene-base resins, polysiloxane-base resins, poly(2-hydroxyethyl (meth)acrylate), polyvinylpyrrolidone, polyethylene oxide, and polyvinyl alcohol are also useful.

The above-mentioned alkali-soluble binder may be copolymers of monomers having hydrophilicity and examples of them are alkoxyalkyl (meth)acrylate, hydroxyalkyl (meth)acrylate, glycerol (meth)acrylate, (meth)acrylamide, N-methylolacrylamide, secondary or tertiary alkylacrylamide, dialkylaminoalkyl (meth)acrylate, morpholine (meth)acrylate, N-vinylpyrrolidone, N-vinylcaprolactam, vinylimidazole, vinyltriazole, methyl (meth)acrylate, ethyl (meth)acrylate, branched or straight propyl (meth)acrylate, branched or straight butyl (meth)acrylate, and phenoxyhydroxypropyl (meth)acrylate.

In addition to the above-exemplified monomers, also usable examples are monomers having tetrahydrofurfuryl, phosphoric acid portion, phosphoric acid ester portion, quaternary ammonium portion, an ethyleneoxy chain, a propyleneoxy chain, sulfonic acid or its salt portion, and morpholinoethyl group.

To improve the cross-linking efficiency, polymerizable groups may exist in side chains and polymers having the polymerizable groups, for example, allyl, (meth)acryl, and aryloxyalkyl groups are also useful. Examples having these polymerizable groups are KS Resist-106 (manufactured by Osaka Organic Chemical Industry Co., Ltd.) and Cyclomer-P series (manufactured by Daicel Chem. Ind., Ltd.).

In terms of improvement in the strength of cured coating, alcohol-soluble nylon and polyethers of 2,2-bis(4-hydroxyphenyl)propane and epichlorohydrin are also useful.

Among these various kinds of binders, alkali-soluble binders usable in the invention are preferably polyhydroxystyrene-based resins, polysiloxane-based resins, acrylic resin, acrylamide-based resins, acryl/acrylamide copolymer resins, and more preferably acrylic resins, polyhydroxystyrene-based resins, and polysiloxane-based resins in terms of heat resistance and the binders are preferably acrylic resins, acrylamide-based resins, and acryl/acrylamide copolymer resins in terms of the controllability of the developability.

Preferable examples of above-mentioned acrylic reins are copolymers of monomers selected from benzyl (meth)acrylate, (meth)acrylic acid, hydroxyethyl (meth)acrylate, and (meth)acrylamide; (meth)acrylic resins having polymerizable side chains, e.g. KS Resist 1-6 (all manufactured by Osaka Organic Chemical Industry Co., Ltd.), and Cyclomer-P series (manufactured by Daicel Chem. Ind., Ltd.).

Also, alkali-soluble phenol resins may also be used. The alkali-soluble phenol resins are suitable in the case where the composition of the invention is made to be a positive composition. Examples of the alkali-soluble phenol resins are novolak resins or vinyl polymers.

Examples of the novolak resins are those obtained by condensing phenols and aldehydes in the presence of an acid catalyst. Examples of the phenols are phenol, cresol, ethylphenol, butylphenol, xylenol, phenylphenol, catechol, resorcinol, pyrogallol, naphthol, and bisphenol A. Examples of the aldehydes are formaldehyde, p-formaldehyde, acetaldehyde, propionaldehyde, and benzaldehyde. Phenols and aldehydes may be used respectively alone or two or more of kinds them in combination.

Specific examples of the novolak resins are condensation products of formalin with (meta) cresol, p-cresol, or their mixtures. The novolak resins may be adjusted to control the molecular weight distribution by using means of classification or the like. Phenolic hydroxyl-containing low molecular weight components such as bisphenol C and bisphenol A may be mixed with the novolak resins.

The binder in the invention is preferably a polymer having a weight average molecular weight of 1000 to $2 \times 10^5$, more preferably 5000 to $5 \times 10^4$, and even more 5000 to $5 \times 10^5$ on the polystylene standard measured by GPC method.

When binder is contained in the composition of the invention, the content of the binder is contained is preferably 10 to 90% by weight, more preferably 20 to 80% by weight, and even more preferably 30 to 70% by weight in the total solid matter of the composition.

<Cross-Linking Agent>

The composition of the invention is useful for giving a cured film containing the above-mentioned azomethine dye represented by the formula (I) and tetraaza porphyrin dye represented by the formula (A) as colorants, having improved light resistance and heat resistance and pattern formability as compared with a conventional composition, and well cured by advantageously promoting the curing reaction and it is also possible to form a more advantageously cured film by additionally using a supplementary cross-linking agent.

The cross-linking agent is not particularly limited if it promotes film curing by cross-linking reaction and examples of the agent are (a) an epoxy resin; (b) a melamine compound, a guanamine compound, a glycol uryl compound, or an urea compound substituted with at least one group selected from a methylol group, an alkoxymethyl group, and an acyloxymethyl group; and (c) a phenol compound, a naphthol compound, or a hydroxyanthracene compound substituted with at least one group selected from a methylol group, an alkoxymethyl group, and an acyloxymethyl group. Among them polyfunctional epoxy reins are particularly preferable.

The epoxy resin (a) may be any compound that has an epoxy group and crosslinking property, and examples thereof include a divalent glycidyl group-containing low molecular weight compound, such as bisphenol A glycidyl ether, ethylene glycol diglycidyl ether, butanediol diglycidyl ether, hexanediol diglycidyl ether, dihydroxybiphenyl diglycidyl ether, diglycidyl phthalate and N,N diglycidylaniline, a trivalent glycidyl group-containing low molecular weight compound, such as trimethylolpropane triglycidyl ether, trimethylolphenol triglycidyl ether and TrisP PA (trisphenol P PA) triglycidyl ether, a tetravalent glycidyl group-containing low molecular weight compound, such as pentaerythritol tetraglycidyl ether and tetramethylolbisphenol A tetraglycidyl ether, a polyvalent glycidyl group-containing low molecular weight compound, such as dipentaerythritol pentaglycidyl ether and dipentaerythritol hexaglycidyl ether, and a glycidyl group-containing polymer compound, such as polyglycidyl (meth)acrylate and a 1,2 epoxy-4 (2 oxiranyl)cyclohexane adduct of 2,2 bis(hydroxymethyl)-1 butanol.

The number of a methylol group, an alkoxymethyl group and an acyloxymethyl group contained in and substituted on the crosslinking agent (b) is generally from 2 to 6 in the case of the melamine compound and from 2 to 4 in the case of the glycoluril compound, the guanamine compound and the urea compound, and is preferably from 5 to 6 in the case of the melamine compound and from 3 to 4 in the case of the glycoluril compound, the guanamine compound and the urea compound.

The melamine compound, the guanamine compound, the glycoluril compound and the urea compound are referred to as a compound (a methylol group-containing compound, an alkoxymethyl group-containing compound or an acyloxymethyl group-containing compound) of the category (b).

The methylol group-containing compound of the category (b) can be obtained by heating an alkoxymethyl group-containing compound in an alcohol in the presence of an acid catalyst, such as hydrochloric acid, sulfuric acid, nitric acid and methanesulfonic acid. The acyloxymethyl group-containing compound of the category (b) can be obtained by mixing and stirring a methylol group-containing compound with an acyl chloride in the presence of a basic catalyst.

Specific examples of the compounds of the category (b) having the aforementioned substituent are shown below.

Examples of the melamine compound include, hexamethylolmelamine, hexamethoxymethylmelamine, a compound obtained by methoxymethylating from 1 to 5 methylol groups of hexamethylolmelamine or a mixture thereof, hexamethoxyethylmelamine, hexaacyloxymethylmelamine, and a compound obtained by acyloxymethlating from 1 to 5 methylol groups of hexamethylolmelamine or a mixture thereof.

Examples of the glycoluril compound include tetramethylolglycoluril, tetramethoxymethylglycoluril, a compound obtained by methoxymethylating from 1 to 3 methylol groups of tetramethylolglycoluril or a mixture thereof, and a compound obtained by acyloxymethylating from 1 to 3 methylol groups of tetamethylolglycoluril or a mixture thereof.

Examples of the urea compound include tetramethylolurea, tetramethoxymethylurea, a compound obtained by methoxymethylating from 1 to 3 methylol groups of tetrarethylolurea or a mixture thereof, and tetramethoxyethylurea.

Examples of the above-mentioned urea compound are tetramethylolurea, tetramethoxymethylurea, compounds obtained by methoxymethylating 1 3 methylol groups of tetramethytolurea or their mixtures, and tetramethoxyethylurea.

The compound included in (b) may be used alone or in combination.

The above-mentioned cross-linking agent (c), that is, a phenol compound, a naphthol compound, or a hydroxyanthracene compound substituted with at least one group selected from a methylol group, an alkoxymethyl group, and an acyloxymethyl group is for suppressing intermixing with a top coating photoresist by the thermal cross-linking and further increasing the film strength similarly to the case of the cross-linking agent (b).

Hereinafter, these compounds may sometimes be referred to as a compound of (c) (a methylol-containing compound, an alkoxymethyl-containing compound, or an acyloxymethyl-containing compound).

The number of the methylol group, the acryloxymethyl group, or an alkoxymethyl group contained in the cross-linking agent (c) is required to be at least two per one molecule and from a viewpoint of the thermal cross-linking property and storage stability, the phenol compounds to be a skeleton whose second position and fourth positions are all substituted are preferable. Also, the naphthol compounds and hydroxyanthracene compounds to be a skeleton in which ortho-positions and para-positions to the OH groups are all substituted are also preferable. The phenol compounds to be a skeleton whose third position and fifth positions may be unsubstituted or substituted. Also, the naphthol compounds and hydroxyanthracene compounds to be a skeleton in which positions other than the ortho-positions to the OH groups may be unsubstituted or substituted.

The methylol group-containing compound of the category (c) can be obtained by using a phenolic hydroxyl group-containing compound whose 2- or 4-position of the phenolic hydroxyl group is a hydrogen atom as a raw material and reacting it with formalin in the presence of a basic catalyst, such as sodium hydroxide, potassium hydroxide, ammonia and tetraatkylammonium hydroxide. The alkoxymethyl group-containing compound of the category (c) can be obtained by heating the methylol group-containing compound of the category (c) in an alcohol in the presence of an acid catalyst, such as hydrochloric acid, sulfuric acid, nitric acid and methanesulfonic acid. The acyloxymethyl group-containing compound of the category (c) can be obtained by reacting the methylol group-containing compound of the category (c) with an acyl chloride in the presence of a basic catalyst.

Examples of the skeleton compound in the cross-linking agent (c) include a phenol compound, naphthol and a hydroxy anthracene compound in which the ortho position or para position of the phenolic OH group is unsubstituted. Specific examples thereof include phenol, the isomers of cresol, 2,3-xylenol, 2,5-xylenol, 3,4-xylenol, 3,5-xylenol, bisphenols such as bisphenol A, 4,4'-bishydroxy biphenyl, TrisP-PA (manufactured by Honshu Chemical Industry Co., Ltd.), naphthol, dihydroxy naphthalene and 2,7-dihydroxy anthracene.

As specific examples of the crosslinking agent of the category (c), examples of the phenol compound include trimethylolphenol, tri(methoxymethyl)phenol, a compound obtained by methoxymethylating from 1 to 2 methylol groups of trimethylolphenol, trimethylol-3 cresol, tri(methoxymethyl)-3 cresol, a compound obtained by methoxymethylating from 1 to 2 methylol groups of trimethylol-3 cresol, a dimethyloleresol, such as 2,6 dimethylol-4 cresol, tetramethylolbisophenol A, tetramethoxymethylbisphenol A, a compound obtained by methoxymethlating from 1 to 3 methylol groups of tetramethylolbisphenol A, tetramethylol-4,4'bishydroxybiphenyl, tetramethoxymethyl-4,4'bishydroxybiphenyl, a hexamethylol compound of TrisP PA, a hexamethoxymethyl compound of TrisP PA, a compound obtained by methoxymethylating from 1 to 5 methylol groups of a hexamethylol compound of TrisP PA, and bishydroxymethylnaphthalenediol.

Also, examples of the hydroxyanthracene compounds may include 1,6-dihydroxymethyl-2,7-dihydroxyanthracene.

Also, examples of the acyloxymethyl-containing compounds may include compounds obtained by acyloxymethylating some or all of methylol groups of the above-mentioned methylol-containing compounds.

Preferable examples among them are trimethylolphenol, bihydroxymethyl-p-cresol, tetramethylolbisphenol A, hexamethylol compounds of TrisP-PA (trade name; manufactured by Honshu Chemical Industry Co., Ld.) and phenol compounds obtained by substituting the methylol groups of these compounds with alkoxymethyl groups or both of methylol groups and alkoxymethyl groups.

The compounds of (c) may be used alone or in combination.

When cross-linking agent is contained in the colored curable composition, the content of the cross-linking agents (a) to (c) is preferably 1 to 70% by weight, more preferably 5 to 50% by weight, and even more preferably 7 to 30% by weight in the total solid matter (weight) of the composition, although it differs depending on the materials. If the content is within the above-mentioned range, sufficient cured hardness and an unexposed part eluting property can reliably be attained and insufficient hardness of the exposed part is prevented from or considerable deterioration of the unexposed part eluting property is efficiently prevented.

<Polymerizable Compound>

The colored curable composition of the invention is preferable to be constituted by adding at least one kind of polymerizable compounds (hereinafter, referred to as a polymerizable monomer in some cases). The polymerizable monomer is mainly contained in the case where the colored curable composition is made to be a negative working composition.

The monomer may be contained in a positive working composition containing a naphthoquinonediazide compound, which will be described later, and in this case, the curing degree of patterns to be formed may be promoted more. Hereinafter the polymerizable monomer will be described more.

The polymerizable monomer is preferably compounds having a boiling point of 100° C. or higher at a normal pressure and having at least one addition-polymerizable ethylenic unsaturated group. The above-mentioned ethylenic unsaturated group is particularly preferably (meth)acryloyl.

In this connection, (meth)acryloyl means acryloyl or methacryloyl and similarly following (meth)acrylate means acrylate or methacrylate.

Examples of the polymerizable monomer are mono-functional acrylates and methacrylates such as polyethylene glycol mono(meth)acrylate, polypropylene glycol mono(meth)acrylate, and phenoxyethyl (meth)acrylate; poly-functional acrylates and methacrylates such as polyethylene glycol di(meth)acrylate, trimethylolethane tri(meth)acrylate, neopentylglycol di(meth)acrylate, pentaerytritol tri(meth)acrylate, pentaerythritol tetra(meth)acrylate, dipentaerythritol penta(meth)acrylate, dipentaerythritol hexa(metharylate, hexanediol (meth)acrylate, trimethylolpropane tri(acryloyloxypropyl) ether, tri(acryloyloxyethyl) isocyanurate, monomers obtained by adding ethylene oxide and propylene oxide to polyfunctional alcohols such as glycerin and trimethylolethane and successively (meth)acrylating the addition compounds, urethane acrylates described in JP-B Nos. 48-41708 and 50-6034 and JP-A No. 51-37193, polyester acrylates described in JP-A No. 48-64183 and JP-B Nos. 49-43191 and 52-30490, and epoxy acrylates which are reaction products of epoxy resins and (meth)acrylic acids; and their mixtures.

Further, examples of the monomers may include photocurable monomers and oligomers introduced in Journal of Japan Adhesive Society (Nippon Secchaku Kyokai Shi) Vol. 20, No. 7, p. 300-308.

The content of a polymerizable monomer in the colored curable composition is preferably 0.1 to 90% by weight, more preferably 1.0 to 80% by weight, and even more preferably 2.0 to 70% by weight in the total solid matter.

<Radiation Sensitive Compound>

The colored curable composition of the invention can preferably be constituted by adding at least one radiation sensitive compounds. A radiation sensitive compound in the invention is a compound capable of causing chemical reaction to generate radical, an acid, or a base by radiation beam such as UV, deep UV, visible light rays, infrared rays, and electron beams and is used for making a coating insoluble in an alkaline developer by cross-linking, polymerizing, or inactivating the binder by decomposition reaction of the acidic group; or polymerizing of the polymerizable monomer or oligomer existing in the coating; or cross-linking the cross-linking agent.

Particularly in the case where the colored curable composition is a negative working composition, a photopolymerization initiator is preferable to be added and in the case where the colored curable composition is a positive working composition, a naphthoquinonediazide compound is preferable to be added.

Photopolymerization Initiator

The photopolymerization initiator is not particularly limited if it is capable of polymerizing the above-mentioned polymerizable monomer and it is preferable to be selected in terms of the properties, starting efficiency, absorption wavelength, availability, and cost. In this connection, the following naphthoquinonediazide compounds may be added to positive working systems and in this case the curing degree of the pattern can further be promoted.

The photopolymerization initiator may include at least one active halogen compound selected from halomethyloxadiazole compounds and halomethyl-s-triazine compounds; benzyldimethyl ketal compounds, α-hyrdoxyketone compounds, α-aminoketone-base compounds, phosphine compounds, metallocene compounds, 3-aryl-substituted cumarin compounds, lophine dimers, triallylimidazole dimers, benzothiazol compounds, benzophenone compounds, acetophenone compounds and their derivatives, cyclopentadiene-benzene-iron complex and its salt, and oxime compounds.

Examples of halomethyloxadiazole compounds, which are active halogen compounds, are 2-halomethyl-5-vinyl-1,3,4-oxadiazole compounds described in JP-B No. 57-6096, 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole.

Examples of halomethyl-s-triazine compounds, which are active halogen compounds, are vinyl-halomethyl-s-triazine compounds described in JP-B No. 59-1281, and 2-(naphtho-1-yl)-4,6-bis-halomethyl-s-triazine compounds and 4-(p-aminophenyl)-2,6-di-halomethyl-s-triazine compounds described in JP-A No. 53-133428.

Other examples include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis(trichloromethyl)-s-triazine, 2-(4-methoxynaphtho-1-yl)-4, 6-bis(trichloromethyl)-s-trazine, 2-(4-thoxynaphtho-1-yl)-4, 6-bis(tichloromethyl)-s-triazine, 2-(4-butoxynaphto-1-yl)-4,6-bis(trichloromethyl)-s-triazine, 2-[4-(2-methoxyethyl)-naphtho-1-yl]-4,6-bis(trichloromethyl)-s-triazine, 2-(4-(2-ethoxyethyl)-naphtho-1-yl)-4,6-bis(trichloromethyl)-s-triazine, 2-[4-(2-butoxyethyl)-naphtho-1-yl]-4,6-bis(trichloromethyl)-s-triazine, 2-(2-methoxynaphtho-1-yl)-4,6-bis(trichloromethyl)-s-triazine, 2-(6-methoxy-5-methylnaphto-2-yl)-4,6-bis(trichloromethyl)-s-triazine, 2-(6-methoxynaphtho-2-yl)-4,6-bis(trichloromethyl)-s-triazine, 2-(5-methoxynaphtho-1-yl)-4,6-bis(trichloromethyl)-s-triazine, 2-(4,7-dimethoxynaphtho-1-yl)-4,6-bis(tichloromethyl)-s-triazine, 2-(6-ethoxynaphtho-2-yl)-4,6-bis(trichloromethyl)-s-triazine, 2-(4,5-dimethoxynaphtho-1-yl)-4,6-bis(trichloromethyl)-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethyl)aminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-d(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylaminophenyl)-2,6-di(trichloromethyl)-s-triazine, 4-(m-chloro-p-N-ethoxycarbonylaminophenyl)-2,6-di(trichloromethyl)-s-triazine, 4-(m-fluoro-p-N-ethoxycarbonylaminophenyl)-2,6-di(trichloromethyl)-s-triazine, 4-(o-bromo-p-N-ethoxycarbonylaminophenyl)-2,6-di(trichloromethyl)-s-triazine, 4-(m-chloro-p-N-ethoxycarbonylaminophenyl)-2,6-di(trichloromethyl)-s-triazine, 4 (o fluoro-p N ethoxycarbonylmethylaminophenyl)-2,6-di(trichloromethyl)-s triazine, 4 (m bromo-p N chloroethylaminophenyl)-2,6 di(trichloromethyl)-s triazine, 4(m-chloro-p-N-chloroethylaminophenyl)-2,6 di(trichloromethyl)-s triazine, 4 (m-fluoro-p-N-chloroethylaminophenyl)-2,6 di(trichloromethyl)-s triazine, 4 (o bromo-p-N chloroethylaminophenyl)-2,6 di(trichloromethyl)-s triazine, 4 (o-chloro-p-N-chloroethylaminophenyl)-2,6 di(trichloromethyl)-s triazine and 4 (o-fluoro-p N-chloroethylaminophenyl)-2,6 di(trichloromethyl)-s triazine.

Additionally, the examples may include TAZ series manufactured by Midori Kagaku Co., Ltd. (e.g., TAZ-107, TAZ-110, TAZ-104, TAZ109, TAZ-140, TAZ-204, TAZ-113, and TAZ-123); T series manufactured by PANCHIM INC. (e.g., TOMS, T-BMP, T-R, and T-B); Irgacure series manufactured by Ciba Specialty Chemicals Inc. (e.g., Irgacure 369, Irgacure 784, Irgacure 651, Irgacure 184, Irgacure 500, Irgacure 1000, Irgacure 149, Irgacure 819, and Irgacure 261); Darocure series manufactured by Ciba Specialty Chemicals Inc. (e.g., Darocure 1173) 4,4'-bis(diethylamino)-benzophenone, 2-(o-benzoyloxime)-1-[4-(phenylthio)phenyl]-1,2-octadione, 2-benzyl-2-dimethylamino-4-morphorinobutylophenone, 2,2-dimethoxy-2-phenylacetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, and benzoin isopropylether.

Examples of the α-aminoketone-base compounds may include Irgacure series manufactured by Ciba Specialty Chemicals Inc. (e.g., Irgacure 907 and Irgacure 369), 2-methyl-1-phenyl-2-morpholinopropan-1-one, 2-methyl-1-[4-(hexyl)phenyl]-2-morpholinopropan-1-one, and 2-ethyl-2-dimethylamino-1-(4-morpholinophenyl)-butan-1-one.

The above-mentioned oxime compounds are not particularly limited and may include 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethane, 1-(4-methylsulfanyl-phenyl)-butane-1,2-butane-2-oxime-O-acetate, 1-(4-methylsulfanyl-phenyl)-butan-1-one-2-oxime-O-acetate, hydroxyimino-(4-methylsulfanyl-phenyl)-ethyl acetate ester-O-acetate, and hydroxyimino-(4-methylsulfanyl-phenyl)-ethyl acetate ester-O-benzoate.

In terms of the availability and stability, with respect to the above-mentioned other initiators, preferable examples are Irgacure 651 as the above-mentioned benzyldimethyl ketal compounds; Irgacure 184, 1173, 500, 1000, and 2959 as the above-mentioned α-hydroxyketone compounds; Irgacure 907 and 369 as the above-mentioned α-aminoketone compounds; Irgacure 1700, 149, 1850, 819, and 184 as the above-mentioned phosphine oxide compounds; and Irgacure 784 and 261 as the above-mentioned metallocene compounds (all manufactured by Ciba Specialty Chemicals Inc.) and their analogous compounds and/or peripheral compounds are also preferable.

As described, since the photopolymerization initiator is desirably a compound which does not generate an acid by decomposition in terms of the light resistance and heat resistance of the colorant (especially the dye), at least one compounds selected from benzyldimethyl ketal compounds, α-hydroxyketone compounds, o-aminoketone-base compounds, phosphine oxide-base compounds, metaliocene compounds, oxime-base compounds, triallylimidazole dimers, benzothiazole-base compounds, benzophenone compounds, acetophenone compounds and their derivatives, and cyclopentadiene-benzene-iron complex and its salts are preferable among the above-exemplified compounds as the compound which does not generate an acid by decomposition.

It is possible to use a conventionally known other photopolymerization initiator other than the above-mentioned photopolymerization initiator for the composition of the invention. Specific examples are v-Polyketal Aldonyl compounds described in U.S. Pat. No. 2,367,660; α-carbonyl compounds described in U.S. Pat. Nos. 2,367,661 and 2,367,670; acyloine ethers described in U.S. Pat. No. 2,448,828; α-hydrocarbon-substituted aromatic acyloine compounds described in U.S. Pat. No. 2,722,512; poly-nucleic quinone compounds described in U.S. Pat. Nos. 3,046,127 and 2,951,758; triallylimidazole dimers/p-aminophenyl ketone combinations described in U.S. Pat. No. 3,549,367; an benzothiazole compound/trihalomethyl-s-triazine compounds described in JP-B No. 51-48516.

The content of the photopolymerization initiator in the colored curable composition is preferably 0.01 to 50% by weight, more preferably 1 to 30% by weight, and even more preferably 1 to 20% by weight in the solid matter of the composition. If the content of the photopolymerization initiator is in a range of 0.01 to 50% by weight, the molecular weight is prevented from becoming so low and thereby the film strength is prevented from becoming weak.

A sensitizer and a photostabilizer may be used in combination with the photopolymerization initiator. Specific examples are benzoin, benzoin methyl ether, 9-fluorene, 2-chloro-9-fluorene, 2-methyl-9-fluorene, 9-anthrone, 2-bromo-9-anthrone, 2-ethyl-9-anthrone, 9,10-anthraquinone, 2-ethyl-9,10-anthraquinone, 2-tert-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzil, dibenzalacetone, p-(dimethylamino)phenyl styryl ketone, p-(diethylamino)phenyl p-methylstyryl ketone, benzophenone, p-(dimethylamino)benzophenone (or Michler's ketone), p-(diethylamino)benzophenone, and benzoanthrone and benzothiazole-base compounds described in JP-B No. 51-48516, Tinuvin 1130 and 400.

Naphthoquinonediazide Compound

A naphthoquinonediazide compound is a compound having at least one o-quinonediazido group and for example, o-naphthoquinonediazido-5-sulfonic acid ester, o-naphthoquinonediazido-5-sulfonic acid amide, o-naphthoquinonediazido-4-sulfonic acid ester, and o-naphthoquinonediazido-4-sulfonic acid amide can be exemplified. These ester compounds and amide compounds can be produced by a conventionally known method from phenol compounds defined by the formula (I) in JP-A Nos. 2-84650 and 3-49437.

When the colored curable composition is made to be positive working, it is preferable to dissolve 2 to 50% by weight and 2 to 30% by weight of the above-mentioned binder (particularly the alkali-soluble phenol resin) and cross-linking agent, respectively in a solvent. The contents of the naphthoquinonediazide compound and the colorant are preferably 2 to 30% by weight and 2 to 50% by weight, respectively, in the solution in which the binder and cross-linking agent are dissolved.

<Solvent>

In general, a solvent may be added in the case of production of the colored curable composition of the invention. Basically, the solvent is not particularly limited if it satisfies the solubility of the respective components and coatability of the curable composition, however it is preferably selected in consideration of the solubility of particularly the binder, coatability and safety.

Specifically preferable examples of the solvent are esters such as ethyl acetate, n-butyl acetate, isobutyl acetate, amyl formate, isoamyl acetate, isobutyl acetate, butyl propionate, isopropyl butyrate, ethyl butyrate, and butyl butyrate; alkyl esters methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, and ethyl ethoxyacetate; 3-oxypropionic acid alkyl esters such as methyl 3-oxypropionate and ethyl 3-oxypropionate; methyl 3-methoxypropionate, ethyl 3-methoxypropionate; methyl 3-ethoxypropionate, and ethyl 3-ethoxypropionate; 2-oxypropionic acid alkyl esters such as methyl 2-oxypropionate, ethyl 2-oxypropionate, and propyl 2-oxypropionate; methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, and ethyl 2-ethoxy-2-methylpropionate; methyl pyruvate, ethyl pyruvate, propyl pyruvate, methyl acetoacetate, ethyl acetoacetate, methyl 2-oxobutanate, and ethyl 2-oxobutanate; ethers such as diethylene glycol dimethyl ether, tetrahydrofuran, ethylene glycol monomethyl ether, ethylene glycol monoethyl ether, methylcellosolve, ethylcellosolve, ethylene glycol monomethyl ether, diethylene glycol monoethyl ether, diethylene glycol monobutyl ether, propylene glycol methyl ether, propylene glycol methyl ether acetate, propylene glycol ethyl ether acetate, and propylene glycol propyl ether acetate; ketones such as methyl ethyl ketone, cyclohexanone, 2-heptanone, and 3-heptanone; aromatic hydrocarbons such as toluene, and xylene, More preferable examples among them are methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, propylene glycol methyl ether acetate. Even more preferable examples among them are ethyl lactate, cyclohexanone, and propylene glycol methyl ether acetate.

<Other Components>

The composition of the invention may be constituted by using the following other components besides the above-mentioned components.

—Thermal Polymerization Initiator—

It is preferable to add a thermal polymerization initiator to the composition of the invention. Examples usable as the thermal polymerization initiator are hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and 2-mercaptobenzimidazole.

—Various Kinds of Additives—

The composition of the invention may contain various kinds of additives, based on the necessity, such as a filler, a polymer compound other than the above-mentioned polymers, a surfactant, a close adhesion promoting agent, an antioxidant, an ultraviolet absorbent, and a coagulation preventive agents.

Specific examples of the various kinds of the additives may include fillers such as glass and alumina; polymer compounds other than the binder resins such as polyethylene glycol monoalkyl ether and polyfluoroalkyl acrylate; surfactants such as nonionic, cationic, and anionic surfactants; close adhesion promoting agent such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane; antioxidants such as 2,2-thiobis(4-methyl-6-tert-butylphenol) and 2,6-di-tert-butylphenol; ultraviolet absorbents such as 2-(3-tert-butyl-5-methyl-2-hydroxyphenyl)-5-chlorobenzotriazole and alkoxybenzophenone; and coagulation preventive agents such as poly(sodium acrylate).

In order to accelerate the dissolution of the non image area to an alkali solution to attain further improvement of the developing property of the colored curable composition of the invention, an organic carboxylic acid, preferably a low molecular weight organic carboxylic acid having a molecular weight of 1,000 or less, may be added to the composition.

Specific examples thereof include an aliphatic monocarboxylic acid, such as formic acid, acetic acid, propionic acid, butyric acid, valeric acid, pivalic acid, caproic acid, diethylacetic acid, enanthic acid and caprylic acid; an aliphatic dicarboxylic acid, such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citaconic acid; an aliphatic tricarboxylic acid, such as tricarballylic acid, aconitic acid and camphoronic acid; an aromatic monocarboxylic acid, such as benzoic acid, toluic acid, cuminic acid, hemellitic acid and mesitylenic acid; an aromatic polycarboxylic acid, such as phthalic acid, isophthalic acid, terephthalic acid, trimellitic acid, trimesic acid, mellophanic acid and pyromellitic acid; and other carboxylic acids, such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid and umbellic acid.

The colored curable composition of the invention is used preferably for forming colored pixels of a color filter to be used in a liquid crystal display (LCD) element and a solid state image pickup element (e.g., CCD, CMOS) and also for producing inks for printing, inks for ink-jet printing, and coating materials.

<<Color Filter and Method for Producing the Same>>

Next, with respect to a color filter of the invention will be described in detail along with its production method.

In the production method of the color filter of the invention, the above-mentioned colored curable composition of the invention is used. The color filter of the invention contains an azomethine dye represented by the above-mentioned formula (I) and a tetraazaporphyrin dye (including tautomers) represented by the formula (A) and is most preferably produced by using the above-mentioned colored curable composition of the invention.

In the production method of the color filter of the invention, a colored curable composition of the invention explained in the foregoing is utilized. The color filter of the invention can be most advantageously constituted by employing the colored curable composition of the invention, coating the colored curable composition on a substrate for example by a coating method such as a spin coating, a cast coating or a roll coating thereby forming a radiation-sensitive composition layer, exposing such layer through a predetermined mask pattern, and developing the layer with a developing solution to obtain a negative- or positive-working colored pattern (image formation). In this process, a curing step of curing the formed colored pattern by a heating and/or an exposure may be provided if necessary. A light or a radiation used in such process is preferably an ultraviolet light such as g-line, h-line or i-line. Also in case the colored curable composition is of a positive-type, there may also be provided a process of post-baking the colored pattern after the image forming process.

In the production method of the color filter, the above-mentioned image forming processes (if necessary including the curing processes) are repeated in accordance with the number of desired hues in the case of the negative working-base and the above-mentioned image forming processes and post-baking processes are repeated in accordance with the number of the desired hues in the case of the positive working-base to produce the color filter.

Examples of the support include soda glass, PYREX™ (registered mark) glass and quartz glass, which are used in a liquid crystal display device or the like, those having a transparent electro-conductive film adhered, and a photoelectric conversion element substrate, such as a silicon substrate, and a complementary metallic oxide semiconductor (CMOS), which are used in a solid state image sensing device or the like. there are some cases where black stripes for separating pixels are formed on the support.

The developer according to the invention may be any one that has such a formulation that dissolves an uncured part of the colored curable composition of the invention but does not dissolve a cured part thereof. Specific examples thereof include a combination of various kinds of organic solvents and an alkali aqueous solution Examples of the organic solvent include those having been described for preparation of the colored curable composition of the invention.

Preferred examples of the alkali aqueous solution include alkali aqueous solutions obtained by dissolving such an alkali compound to a concentration of 0.001 to 1% by mass, and preferably from 0.01 to 1% by mass, as sodium hydroxide, potassium hydroxide, sodium carbonate, sodium silicate, sodium metasilicate, aqueous ammonia, ethylamine, diethylamine, dimethylmethanolamine, tetramethylammonium hydroxide, tetraethylammonium hydroxide, choline, pyrrole, piperidine and 1,8 diazabicyclo-(5.4.0)-7 undecene. In the case where a developer containing the alkali aqueous solution is used, the layer thus developed is generally washed with water.

The color filter according to the invention is suitable for a liquid crystal display device and a solid state image sensing device, and particularly suitable for CCD, a CMOS device and an electroluminescence device of high resolution exceeding 1,000,000 pixels. The color filter according to the invention can be used, for example, as such a color filter that is disposed between light accepting parts of pixels and microlenses for light condensation, which constitute CCD.

EXAMPLES

Hereinafter, the invention is more specifically described along with Examples, however Examples are illustrative of the invention and are not to be construed as limiting the invention there to. Various modifications and applications may be made without departing from the spirit and scope of the invention as defined by the appended claims. Additionally, "part" is on the basis of weight unless otherwise specified.

Examples 1 to 19 and Comparative Example 1

1) Preparation of Dye-Containing Curable Composition

Compounds of the compositions shown the following Table 1 were mixed and dissolved to prepare dye-containing curable compositions (1) to (19) of the invention and a dye-containing curable composition (20) for comparison.

TABLE 1

| composition | | alkali-soluble binder | radical polymerizable monomer | organic solvent-soluble dye represented by the formula (I)*1 | organic solvent-soluble dye represented by the formula (A)*2 | photopolymerization initiator | surfactant | organic solvent |
|---|---|---|---|---|---|---|---|---|
| Example 1 | (1) | resin A (5.14 g) | monomer A (7.73 g) | exemplified dye M-3 (1.5 g) | Example 8 (4.5 g) | TAZ107 (1.1 g) | — | ethyl lactate (80 g) |
| Example 2 | (2) | resin A (5.14 g) | monomer A (7.73 g) | exemplified dye M-4 (1.5 g) | Example 20 (4.5 g) | TAZ104 (1.1 g) | — | (80 g) |
| Example 3 | (3) | resin A (5.14 g) | monomer A (7.73 g) | exemplified dye M-9 (1.5 g) | Example 28 (4.5 g) | TAZ104 (1.1 g) | — | (80 g) |
| Example 4 | (4) | resin A (5.14 g) | monomer A (7.73 g) | exemplified dye M-8 (1.5 g) | Example 28 (4.5 g) | TAZ107 (1.1 g) | — | (80 g) |
| Example 5 | (5) | resin A (5.14 g) | monomer A (7.73 g) | exemplified dye M-18 (1.5 g) | Example 47 (4.5 g) | TAZ104 (1.1 g) | — | ethyl lactate (80 g) |
| Example 6 | (6) | resin A (5.14 g) | monomer A (7.73 g) | exemplified dye M-25 (1.5 g) | Example 58 (4.5 g) | TAZ107 (1.1 g) | — | ethyl lactate (80 g) |
| Example 7 | (7) | resin A (5.14 g) | monomer A (7.73 g) | exemplified dye M-76 (1.5 g) | Example 89 (4.5 g) | TAZ107 (1.1 g) | — | ethyl lactate (80 g) |
| Example 8 | (8) | resin A (5.14 g) | monomer A (7.73 g) | exemplified dye M-3 (1.5 g) | Example 8 (4.5 g) | oxime A (1.1 g) | — | cyclohexanone (80 g) |
| Example 9 | (9) | resin A (5.14 g) | monomer A (7.73 g) | exemplified dye M-4 (1.5 g) | Example 20 (4.5 g) | oxime A (1.1 g) | — | cyclohexanone (80 g) |
| Example 10 | (10) | resin A (5.14 g) | monomer A (7.73 g) | exemplified dye M-9 (1.5 g) | Example 28 (4.5 g) | oxime A (1.1 g) | — | cyclohexanone (80 g) |
| Example 11 | (11) | resin A (5.14 g) | monomer A (7.73 g) | exemplified dye M-8 (1.5 g) | Example 28 (4.5 g) | oxime A (1.1 g) | — | cyclohexanone (80 g) |
| Example 12 | (12) | resin A (5.14 g) | monomer A (7.73 g) | exemplified dye M-18 (1.5 g) | Example 47 (4.5 g) | oxiane A (1.1 g) | — | ethyl lactate (80 g) |
| Example 13 | (13) | resin A (5.14 g) | monomer A (7.73 g) | exemplified dye M-25 (1.5 g) | Example 58 (4.5 g) | oxime B (1.1 g) | — | ethyl lactate (80 g) |
| Example 14 | (14) | resin A (5.14 g) | monomer A (7.73 g) | exemplified dye M-76 (1.5 g) | Example 89 (4.5 g) | oxime A (1.1 g) | — | ethyl lactate (80 g) |
| Example 15 | (15) | resin A (5.14 g) | monomer A (7.73 g) | exemplified dye M-9 (1.5 g) | Example 28 (4.5 g) | oxime A (1.1 g) | F475 (0.01 g) | ethyl lactate (80 g) |
| Example 16 | (16) | — | monomer A (12.6 g) | exemplified dye M-3 (1.7 g) | Example 9 (4.6 g) | oxime A (1.1 g) | — | cyclohexanone (80 g) |
| Example 17 | (17) | — | monomer A (12.6 g) | exemplified dye M-8 (1.7 g) | Example 28 (4.6 g) | oxime B (1.1 g) | — | cyclohexanone (80 g) |
| Comparative Example 1 | (20) | resin A (5.14 g) | monomer A (7.73 g) | following comparative compound (6.0 g) | C.I. Solvent Blue 67 | oxime A (1.1 g) | — | ethyl lactate (80 g) |

*1: exemplified dye materials in the column of Examples are azomethine dye within the scope of the invention.
*2: specific examples in the column of Examples are tetraazaporphyrin dye within the scope of the invention.

Synthesis of the Comparative Compound

At first, 12 g of copperphthalocyanine (manufactured by Tokyo Kasei Kogyo Co., Ltd.) was added little by little to 120 g of chlorosulfonic acid at 20° C. or lower for 30 minutes. Next, the mixture was heated to 70 to 80° C., stirred at that temperature for 1 hour, successively heated to 130 to 135° C. for 2 hours, kept at that temperature for 4 hours, and after carrying out the reaction, cooled to 80° C. Further, 20 g of thionyl chloride was added dropwise for 1 hour while the temperature is kept at 70 to 80° C. and successively the resulting mixture was stirred at 70 to 80° C. for 4 hours. The reaction solution was cooled to 15 to 20° C. and stirred at the temperature for 12 hours. After the reaction mixture solution was discharged little by little in to 1000 g of iced water, the precipitated product was separated by filtration and washed with iced water until neutralized to obtain phthalocyanine sulfonylchloride in water-containing paste state.

Immediately after that, the obtained product was poured in 400 g of iced water and dispersed and stirred at 10° C. or lower for 30 minutes, 20 g of 3-butoxypropylamine was added dropwise. Next, after the mixture was heated to 20 to 30° C. and stirred at that temperature for 18 hours, the produced product was separated by filtration and dispersed in 200 g of water and filtration were repeated two times and the product was dried at 60° C. for 15 hours to obtain 15 g of a blue powder. The powder was recrystallized using ethyl acetate to obtain 6.4 g of blue crystal (Comparative compound). The blue crystals were to have an average of 3.8 sulfonamido groups per one molecule from the intensity ratio of copper, the center metal of the phthalocyanine skeleton, and sulfur atoms of the sulfonamido group by fluorescent x-ray analysis.

The details of compositions in Table 1 are as follows.

resin A: benzyl methacrylate/methacrylic acid copolymer (70/30 (mole ratio))

monomer A: DPHA, manufactured by Nippon Kayaku Co., Ltd. (trade name; main component: dipentaerythritol hexaacrylate)

TAZ-107: manufactured by Midori Kagaku Co., Ltd.

TAZ-104: manufactured by Midori Kagaku Co., Ltd.

Oxime A: 2-(O-benzoyloxime)-1-[4-(phenylthio)phenyl]-1,2-octanedione; manufactured by Ciba Specialty Chemicals Inc.

Oxime B: 1-(O-acetyloxime)-1-[9-ethyl-6-(2-methylbenzoyl)-9H-carbazole-3-yl]ethanone; manufactured by Ciba Specialty Chemicals Inc.

F475: surfactant manufactured Dainippon Ink and Chemicals, Inc.

Example 18

Positive-Working Dye-Containing Curable Composition

The following composition components were mixed to obtain a positive-working dye-containing curable composition (18).

Dye Compound of the Invention

The above-exemplified dye M-9 (dye represented by the formula (I)) 4.5 g

The above-mentioned example 28 (dye represented by the formula (A)) 1.5 g

Ethyl lactate 80.0 g

The following binder P-1 18.0 g

The following photo-acid generator PAG-1 2.0 g

Fluoro-base surfactant [trade name: F475, manufactured by Dainippon Ink and Chemicals, Inc.] 0.01 g

P-1

PAG-1

Example 19

Positive-Working Dye-Containing Curable Composition

The following composition components were mixed to obtain a positive-working dye-containing curable composition (19).

Dye Compound of the Invention

The above-exemplified dye M-8 (dye represented by the formula (I)) 4.5 g

The above-mentioned example 28 (dye represented by the formula (A)) 1.5 g

Ethyl lactate 80.0 g

Novolak resin obtained by condensation of p-cresol and formaldehyde (5,500 on the polystyrene molecular weight standard) 6.0 g Hexametoxymethylolmelamine 2.0 g 2,3,4-Trihydroxybenzophenone o-naphthoquinonediazide-5-sulfonyl chloride ester compound (esterification ratio: 80 mol %; quinonediazide compound) 6.0 g

[4-(7,8-dihydroxy-2,4,4-trimethyl-2-curomanyl)pyrogallol] esterified with o-naphthoquinonediazido-5-sulfonic acid 6.0 g.

2) Production of Undercoated Glass Substrate

Resist CT-2000L solution (manufactured by Fuji Film Electronics Materials Co., Ltd.) was applied in a film thickness of 2 µp to a glass substrate by a spin coater and dried at 220° C. for 1 hour to form a cured coating (an undercoating layer).

3) Exposure/Development (Image Formation) of the Dye-Containing Curable Composition Each of the dye-containing curable compositions obtained in the above-described 1) was applied in a film thickness of 1 µm to the undercoating layer on the undercoated glass substrate obtained as described in 2) by a spin coater and pre-baked at 100° C. for 120 seconds.

Next, ultraviolet rays were irradiated to the coated film through a 2 cm-square mask by using a UV exposure apparatus and successively development with 100% CD-2000 development solution (manufactured by Fuji Film Electronics Materials Co., Ltd.) (Examples 1 to 17 and Comparative Example 1) or with FHD-5 development solution (manufactured by Fuji Film Electronics Materials Co., Ltd.) (Examples 18 and 19) at 23° C. for 60 seconds. Next, rinsing with flowing water for 20 seconds and spray drying were carried out to obtain each patterned image (each color filter).

4) Evaluation

The following evaluations were carried out for the dye-containing curable compositions (1) to (20) obtained by respective Examples and Comparative Example. The evaluation results are shown in the following Table 2.

—1. Pattern Formability—

Each pattern image obtained in the above-mentioned manner was observed by a common method using an optical microscope and evaluated according to the following evaluation criteria

[Evaluation Criteria]

A: excellent pattern was obtained without development residue existing in the un-exposed parts.

B: noticeable development residue existed noticeably in the un-exposed part.

—2. Heat Resistance and Light Resistance—

After application and pre-baking were carried out in the same manner as described in above-mentioned 3), each film was heated at 200° C. for 5 minutes to cure the film and the cured film was subjected to spectroscopic measurement by MCPD-1000 (manufactured by Otsuka Electronics Co., Ltd.) to obtain standard values.

<Heat Resistance>

Each glass substrate on which the cured film was formed was put on a hot plate at 200° C. and then again subjected to spectroscopic measurement. The obtained value was defined as the spectroscopic value relative to the above-mentioned standard value and Δ E*ab was calculated from both values accordingly to a chromaticity calculation program.

<Lightfastness>

After each glass substrate on which the cured film was formed was exposed to 200,000 lux×20 hours by a lightfastness tester (manufactured by Suga Shiken Ki Co, Ltd.) and again subjected to spectroscopic measurement and the obtained value was defined as the spectroscopic value relative to the above-mentioned standard value and ΔE*ab was calculated from both values accordingly to a chromaticity calculation program.

TABLE 2

|  | Pattern formability | heat resistance Δ E * ab | light resistance Δ E * ab |
| --- | --- | --- | --- |
| Example 1 | A | 4.5 | 6.5 |
| Example 2 | A | 4.2 | 6.4 |
| Example 3 | A | 4.3 | 6.5 |
| Example 4 | A | 4.5 | 6.3 |
| Example 5 | A | 4.4 | 6.4 |
| Example 6 | A | 4.1 | 6.2 |
| Example 7 | A | 4.5 | 6.4 |
| Example 8 | A | 3.5 | 5.4 |
| Example 9 | A | 3.6 | 5.2 |
| Example 10 | A | 3.4 | 5.1 |

TABLE 2-continued

|  | Pattern formability | heat resistance Δ E * ab | light resistance Δ E * ab |
| --- | --- | --- | --- |
| Example 11 | A | 3.3 | 5.2 |
| Example 12 | A | 3.4 | 5.3 |
| Example 13 | A | 3.3 | 5.1 |
| Example 14 | A | 3.6 | 5.2 |
| Example 15 | A | 3.4 | 5.1 |
| Example 16 | A | 2.9 | 4.8 |
| Example 17 | A | 2.8 | 4.7 |
| Example 18 | A | 6.4 | 8.2 |
| Example 19 | A | 6.2 | 8.1 |
| Comparative Example 1 | B | 10.5 | 14.6 |

As being shown in Table 2, light resistance and heat resistance are excellent and the pattern formability is excellent with suppressed development residue in the case of samples of the Examples. On the other hand, in the case of Comparative Example 1, the development residue in the un-developed parts is considerable and thus the pattern formability is inferior and light resistance and heat resistance after curing are also insufficient.

Since the examples of the dye compounds according to the invention mentioned above; other than the dyes used in the above-mentioned Examples, have similar structure to those of the Examples (dye compounds of the Examples of the invention) similar effects can be obtained, and it is expected to be possible to obtain excellent light resistance and heat resistance and good pattern formability.

The invention includes the following.

<1> A colored curable composition comprising at least one azomethine dye represented by the following formula (I) and at least one tetraazaporphyrin dye represented by following formula (A):

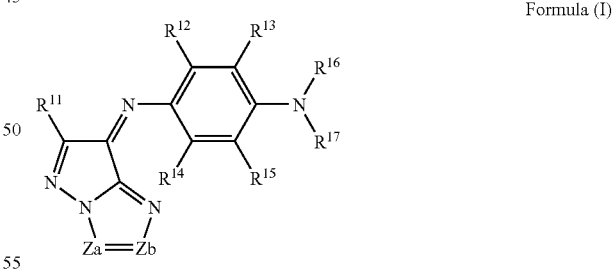

Formula (I)

wherein $R^{11}$ represents a hydrogen atom or a substituent group; $R^{12}$, $R^{13}$, $R^{14}$, and $R^{15}$ each independently represent a hydrogen atom, or a substituent group; $R^{16}$ and $R^{17}$ each independently represent an alkyl, an alkenyl, an aryl or a heterocyclic group; Za and Zb each independently represent —N=, or —C($R^{18}$)=; $R^{18}$ represents a hydrogen atom, an alkyl, an alkenyl, an aryl, or a heterocyclic group; $R^{12}$ and $R^{13}$, $R^{13}$ and $R^{16}$, $R^{14}$ and $R^{15}$, $R^{15}$ and $R^{17}$ or $R^{16}$ and $R^{17}$ each independently may be bonded to each other to form a 5- to 7-membered ring;

Formula (A)

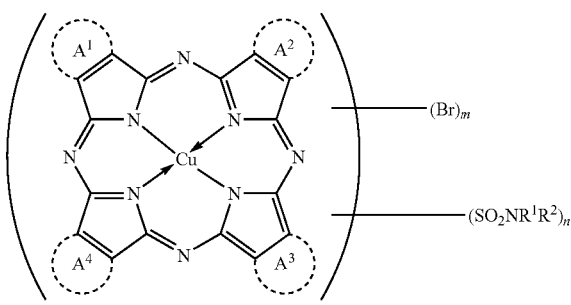

wherein ring $A^1$, ring $A^2$, ring $A^3$, and ring $A^4$ each independently represent the following formula(1) or formula(2) and at least one of ring $A^1$, ring $A^2$, ring $A^3$, and ring $A^4$ represents formula(2);

Formula (1)

Formula (2)

$R^1$ and $R^2$ each independently represent a hydrogen atom or a substituted or unsubstituted alkyl group; m represents an integer of 1 to 8; n represents an integer of 1 to 4; $R^1$ and $R^2$ do not simultaneously represent hydrogen atoms.

<2> The colored curable composition according to <1>, wherein the azomethine dye is an azomethine dye represented by the following formula (II):

Formula (II)

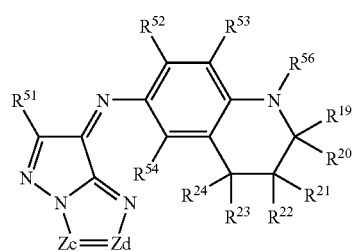

wherein $R^{51}$ represents a hydrogen atom or a substituent group; $R^{52}$, $R^{53}$, and $R^{54}$ each independently represent a hydrogen atom or a substituent group; $R^{56}$ represents an alkyl, an alkenyl, an aryl or a heterocyclic group; $R^{19}$, $R^{20}$, $R^{21}$, $R^{22}$, $R^{23}$, and $R^{24}$ each independently represent a hydrogen atom or a substituent group; Zc and Zd each independently represent —N= or —C($R^{18}$)=; and $R^{18}$ represents a hydrogen atom, an alkyl, an alkenyl, an aryl, or a heterocyclic group.

<3> The colored curable composition according to <1>, wherein the azomethine dye is an azomethine dye represented by the following formula (III):

Formula (III)

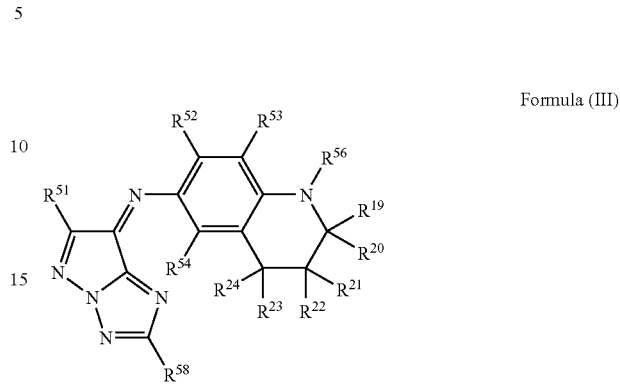

wherein $R^{51}$ represents a hydrogen atom or a substituent group; $R^{52}$, $R^{53}$, and $R^{54}$ each independently represent a hydrogen atom or a substituent group; $R^{19}$, $R^{20}$, $R^{21}$, $R^{22}$, $R^{23}$, and $R^{24}$ each independently represent a hydrogen atom or a substituent group; $R^{56}$ represents an alkyl, an alkenyl an aryl or a heterocyclic group; and $R^{58}$ represents a hydrogen atom, an alkyl, an alkenyl, an aryl or a heterocyclic group.

<4> The colored curable composition according to <3>, wherein $R^{51}$ of the azomethine dye represented by the formula (III) represents an alkyl, an alkenyl, an aryl, a heterocyclic group, an alkoxycarbonyl, a carbamoyl, an imido group, an alkylthio group, an arylthio group, a heterocyclic thio group, an alkylsulfonyl group, or an arylsulfonyl group.

<5> The colored curable composition according to one of <1> to <4>, wherein $R^1$ and $R^2$ of the tetraazaporphyrin dye represented by the formula (A) each independently represent a hydrogen atom provided that $R^1$ and $R^2$ do not simultaneously represent hydrogen atoms, an un-substituted alkyl, or a substituted alkyl group having an oxygen atom in the form of at least one of an ether bond, a carbonyl bond and an ester bond.

<6> The colored curable composition according to one of <1> to <5>, wherein $R^1$ and $R^2$ of the tetraazaporphyrin dye represented by the formula (A) each independently represent a hydrogen atom provided that $R^1$ and $R^2$ do not simultaneously represent hydrogen atoms, an un-substituted alkyl having 1 to 12 carbon atoms, or a substituted alkyl group having 2 to 12 carbon atoms and 1 to 4 oxygen atoms in the form of at least one of an ether bond, a carbonyl bond and an ester bond; and m represents an integer of 1 to 4.

<7> The colored curable composition according to one of <1> to <6>, wherein at least one of $R^1$ and $R^2$ of the tetraporphyrin dye represented by the formula (A) represents a substituted alkyl group having 2 to 12 carbon atoms and 1 to 4 oxygen atoms in the form of at least one of an ether bond, a carbonyl bond and an ester bond.

<8> The colored curable composition according to <7>, wherein at least one of $R^1$ and $R^2$ the tetraazaporphyrin dye represented by the formula (A) represents a substituted alkyl group represented by the following formula (B):

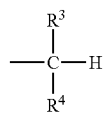

Formula (B)

wherein $R^3$ and $R^4$ each independently represent a hydrogen atom, an un-substituted alkyl group, a substituted alkyl group having at least an oxygen atom in the form of at least one of an ether bond, a carbonyl bond and an ester bond, an alkylcarbonyl group, or an alkoxycarbonyl group; and at least one of $R^3$ and $R^4$ represents a substituted alkyl group having an oxygen atom in the form of at least one of an ether bond, a carbonyl bond and an ester bond.

<9> The colored curable composition according to <8>, wherein $R^3$ and $R^4$ each independently represent a hydrogen atom, an un-substituted alkyl group having 1 to 8 carbon atoms, a substituted alkyl group having 2 to 10 carbon atoms and 1 to 4 oxygen atoms in the form of at least one of an ether bond, a carbonyl bond and an ester bond, an alkylcarbonyl group having 2 to 10 carbon atoms, or an alkoxycarbonyl group having 2 to 10 carbon atoms; and at least one of $R^3$ and $R^4$ represents a substituted alkyl group having 2 to 10 carbon atoms and 1 to 4 oxygen atoms in the form of at least one of an ether bond, a carbonyl bond and an ester bond, an alkylcarbonyl group having 2 to 10 carbon atoms, or an alkoxycarbonyl group having 2 to 10 carbon atoms.

<10> The colored curable composition according to <1>, wherein the azomethine dye represented by the formula (I) is an azomethine dye represented by the formula (III) and $R^1$ and $R^2$ in the tetraazaporphyrin dye represented by the formula (A) each independently represent a hydrogen atom provided that $R^1$ and $R^2$ do not simultaneously represent hydrogen atoms), an un-substituted alkyl group having 1 to 12 carbon atoms, or a substituted alkyl group having 2 to 12 carbon atoms and 1 to 4 oxygen atoms in the form of at least one of an ether bond, a carbonyl bond and an ester bond; and m represents an integer of 1 to 4.

<11> A color filter, comprising at least one of azomethine dye represented by the above-mentioned formula (I) and at least one of tetrazaporphyrin dye represented by the above-mentioned formula (A).

<12> A color filter, comprising the color curable composition according to one of <2> to <10>.

<13> A method of producing a color filter comprising; applying the colored curable composition according to one of <1> to <10> onto a substrate; then exposing the applied colored curable composition through a mask; and developing the exposed colored curable composition to form a pattern.

According to the invention, a color curable composition having a good hue (molar absorption coefficient and color value), vividness and excellent in light resistance, beat resistance, and pattern formability (developability) is provided and a color filter having pattern definition (particularly having a good cross-section with a good rectangular shape) at a high degree of resolution and good hue and excellent in light resistance and heat resistance, and a manufacturing method of a color filter capable of preventing development residue in non-cured parts and manufacturing a color filter with high productivity (high cost performance) can be provided.

All publications, patent applications, and technical standards mentioned in this specification are herein incorporated by reference to the same extent as if each individual publication, patent application, or technical standard was specifically and individually indicated to be incorporated by reference.

It will be obvious to those having skill in the art that many changes may be made in the above-described details of the preferred embodiments of the present invention. The scope of the invention, therefore, should be determined by the following claims.

What is claimed is:

1. A colored curable composition comprising a radiation sensitive compound and a polymerizable compound, at least one azomethine dye represented by the following formula (I) and at least one tetraazaporphyrin dye represented by following formula (A):

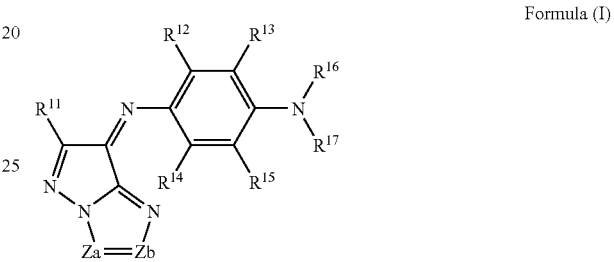

Formula (I)

wherein $R^{11}$ represents a hydrogen atom or a substituent group; $R^{12}$, $R^{13}$, $R^{14}$, and $R^{15}$ each independently represent a hydrogen atom, or a substituent group; $R^{16}$ and $R^{17}$ each independently represent an alkyl, an alkenyl, an aryl or a heterocyclic group; Za and Zb each independently represent —N═, or —C($R^{18}$)═; $R^{18}$ represents a hydrogen atom, an alkyl, an alkenyl, an aryl, or a heterocyclic group; $R^{12}$ and $R^{13}$, $R^{13}$ and $R^{16}$, $R^{14}$ and $R^{15}$, $R^{15}$ and $R^{17}$ or $R^{16}$ and $R^{17}$ each independently may be bonded to each other to form a 5- to 7-membered ring;

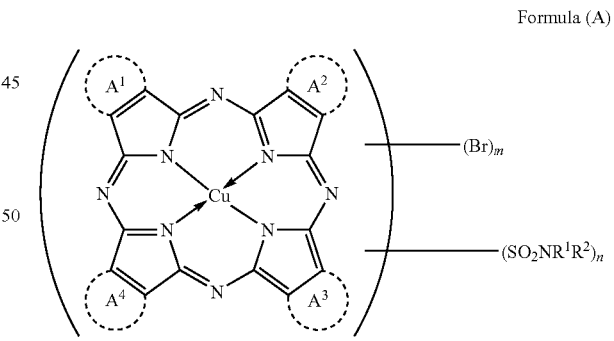

Formula (A)

wherein ring $A^1$, ring $A^2$, ring $A^3$, and ring $A^4$ each independently represent the following formula(1) or formula (2) and at least one of ring $A^1$, ring $A^2$, ring $A^3$, and ring $A^4$ represents formula (2);

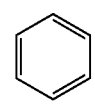

Formula (1)

-continued

Formula (2)

$R^1$ and $R^2$ each independently represent a hydrogen atom or a substituted or unsubstituted alkyl group; m represents an integer of 1 to 8; n represents an integer of 1 to 4; $R^1$ and $R^2$ do not simultaneously represent hydrogen atoms.

2. The colored curable composition according to claim 1, wherein the azomethine dye is an azomethine dye represented by the following formula (II):

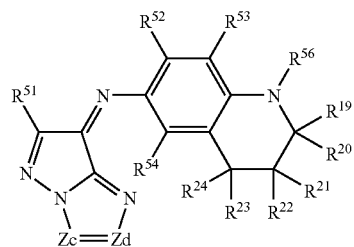
Formula (II)

wherein $R^{51}$ represents a hydrogen atom or a substituent group; $R^{52}$, $R^{53}$, and $R^{54}$ each independently represent a hydrogen atom or a substituent group; $R^{56}$ represents an alkyl, an alkenyl, an aryl or a heterocyclic group; $R^{19}$, $R^{20}$, $R^{21}$, $R^{22}$, $R^{23}$, and $R^{24}$ each independently represent a hydrogen atom or a substituent group; Zc and Zd each independently represent —N= or —C($R^{18}$)=; and $R^{18}$ represents a hydrogen atom, an alkyl, an alkenyl, an aryl, or a heterocyclic group.

3. A method of producing a color filter comprising; applying the colored curable composition according to claim 2 onto a substrate; then exposing the applied colored curable composition through a mask; and developing the exposed colored curable composition to form a pattern.

4. The colored curable composition according to claim 1, wherein the azomethine dye is an azomethine dye represented by the following formula (III):

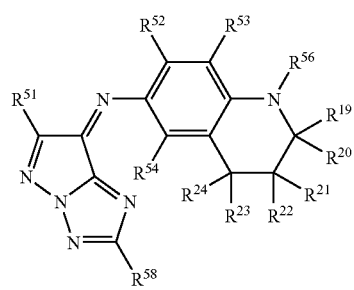
Formula (III)

wherein $R^{51}$ represents a hydrogen atom or a substituent group; $R^{52}$, $R^{53}$, and $R^{54}$ each independently represent a hydrogen atom or a substituent group; $R^{19}$, $R^{20}$, $R^{21}$, $R^{22}$, $R^{23}$, and $R^{24}$ each independently represent a hydrogen atom or a substituent group; $R^{56}$ represents an alkyl, an alkenyl, an aryl or a heterocyclic group; and $R^{58}$ represents a hydrogen atom, an alkyl, an alkenyl, an aryl or a heterocyclic group.

5. The colored curable composition according to claim 4, wherein $R^{51}$ of the azomethine dye represented by the formula (III) represents an alkyl, an alkenyl, an aryl, a heterocyclic group, an alkoxycarbonyl, a carbamoyl, an imido group, an alkylthio group, an arylthio group, a heterocyclic thio group, an alkylsulfonyl group, or an arylsulfonyl group.

6. The colored curable composition according to claim 4, wherein the azomethine dye represented by the formula (I) is an azomethine dye represented by the formula (III) and $R^1$ and $R^2$ in the tetraazaporphyrin dye represented by the formula (A) each independently represent a hydrogen atom provided that $R^1$ and $R^2$ do not simultaneously represent hydrogen atoms), an un-substituted alkyl group having 1 to 12 carbon atoms, or a substituted alkyl group having 2 to 12 carbon atoms and 1 to 4 oxygen atoms in the form of at least one of an ether bond, a carbonyl bond and an ester bond; and m represents an integer of 1 to 4.

7. A color filter, comprising the colored curable composition according to claim 6.

8. A color filter, comprising the colored curable composition according to claim 4.

9. The colored curable composition according to claim 1, wherein $R^1$ and $R^2$ of the tetraazaporphyrin dye represented by the formula (A) each independently represent a hydrogen atom provided that $R^1$ and $R^2$ do not simultaneously represent hydrogen atoms, an un-substituted alkyl, or a substituted alkyl group having an oxygen atom in the form of at least one of an ether bond, a carbonyl bond and an ester bond.

10. A method of producing a color filter comprising; applying the colored curable composition of claim 9 onto a substrate; then exposing the applied colored curable composition through a mask; and developing the exposed colored curable composition to form a pattern.

11. The colored curable composition according to claim 1, wherein $R^1$ and $R^2$ of the tetraazaporphyrin dye represented by the formula (A) each independently represent a hydrogen atom provided that $R^1$ and $R^2$ do not simultaneously represent hydrogen atoms, an un-substituted alkyl having 1 to 12 carbon atoms, or a substituted alkyl group having 2 to 12 carbon atoms and 1 to 4 oxygen atoms in the form of at least one of an ether bond, a carbonyl bond and an ester bond; and m represents an integer of 1 to 4.

12. A method of producing a color filter comprising; applying the colored curable composition according to claim 11 onto a substrate; then exposing the applied colored curable composition through a mask; and developing the exposed colored curable composition to form a pattern.

13. The colored curable composition according to claim 1, wherein at least one of $R^1$ and $R^2$ the tetraazaporphyrin dye represented by the formula (A) represents a substituted alkyl group having 2 to 12 carbon atoms and 1 to 4 oxygen atoms in the form of at least one of an ether bond, a carbonyl bond and an ester bond.

14. A method of producing a color filter comprising; applying the colored curable composition according to claim 13 onto a substrate, then exposing the applied colored curable composition through a mask; and developing the exposed colored curable composition to form a pattern.

15. The colored curable composition according to claim 1, wherein at least one of $R^1$ and $R^2$ the tetraazaporphyrin dye represented by the formula (A) represents a substituted alkyl group represented by the following formula (B):

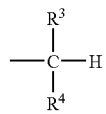

Formula (B)

wherein $R^3$ and $R^4$ each independently represent a hydrogen atom, an un-substituted alkyl group, a substituted alkyl group having at least an oxygen atom in the form of at least one of an ether bond, a carbonyl bond and an ester bond, an alkylcarbonyl group, or an alkoxycarbonyl group; and at least one of $R^3$ and $R^4$ represents a substituted alkyl group having an oxygen atom in the form of at least one of an ether bond, a carbonyl bond and an ester bond.

16. The colored curable composition according to claim 15, wherein $R^3$ and $R^4$ each independently represent a hydrogen atom, an un-substituted alkyl group having 1 to 8 carbon atoms, a substituted alkyl group having 2 to 10 carbon atoms and 1 to 4 oxygen atoms in the form of at least one of an ether bond, a carbonyl bond and an ester bond, an alkylcarbonyl group having 2 to 10 carbon atoms, or an alkoxycarbonyl group having 2 to 10 carbon atoms; and at least one of $R^3$ and $R^4$ represents a substituted alkyl group having 2 to 10 carbon atoms and 1 to 4 oxygen atoms in the form of at least one of an ether bond, a carbonyl bond and an ester bond, an alkylcarbonyl group having 2 to 10 carbon atoms, or an alkoxycarbonyl group having 2 to 10 carbon atoms.

17. A method of producing a color filter comprising; applying the colored curable composition according to claim 16 onto a substrate; then exposing the applied colored curable composition through a mask; and developing the exposed colored curable composition to form a pattern.

18. A method of producing a color filter comprising; applying the colored curable composition according to claim 15 onto a substrate; then exposing the applied colored curable composition through a mask; and developing the exposed colored curable composition to form a pattern.

19. A method of producing a color filter comprising; applying the colored curable composition according to claim 1 onto a substrate; then exposing the applied colored curable composition through a mask; and developing the exposed colored curable composition to form a pattern.

20. A color filter comprising at least one azomethine dye represented by the following formula (I) and at least one of tetraazaporphyrin dye represented by the following formula (A):

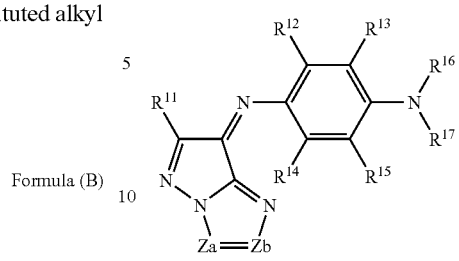

Formula (I)

wherein $R^{11}$ represents a hydrogen atom or a substituent group; $R^{12}$, $R^{13}$, $R^{14}$, and $R^{15}$ each independently represent a hydrogen atom, or a substituent group; $R^{16}$ and $R^{17}$ each independently represent an alkyl, an alkenyl, an aryl or a heterocyclic group; Za and Zb each independently represent —N=, or —C($R^{18}$)=; $R^{18}$ represents a hydrogen atom, an alkyl, an alkenyl, an aryl, or a heterocyclic group; $R^{12}$ and $R^{13}$, $R^{13}$ and $R^{16}$, $R^{14}$ and $R^{15}$, $R^{15}$ and $R^{17}$ or $R^{16}$ and $R^{17}$ each independently may be bonded to each other to form a 5- to 7-membered ring;

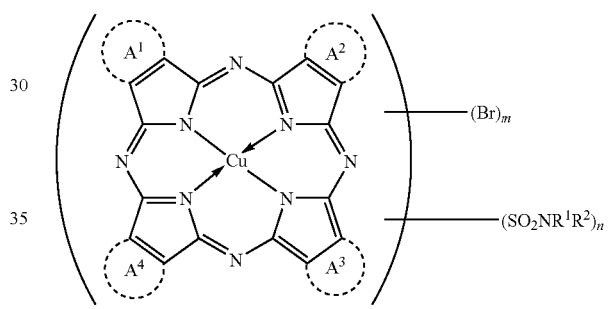

Formula (A)

wherein ring $A^1$, ring $A^2$, ring $A^3$, and ring $A^4$ each independently represent the following formula(1) or formula (2) and at least one of ring $A^1$, ring $A^2$, ring $A^3$, and ring $A^4$ represents formula (2);

Formula (1)

Formula (2)

$R^1$ and $R^2$ each independently represent a hydrogen atom provided that $R^1$ and $R^2$ do not simultaneously represent hydrogen atoms, an unsubstituted alkyl group having 1 to 12 carbon atoms, or a substituted alkyl group having 2 to 12 carbon atoms and 1 to 4 oxygen atoms in the form of at least one of an ether bond, a carbonyl bond and an ester bond; m represents an integer of 1 to 8; n represents an integer of 1 to 4.

* * * * *